(12) United States Patent
Lee et al.

(10) Patent No.: US 9,392,657 B2
(45) Date of Patent: Jul. 12, 2016

(54) LIGHTING CONTROL SYSTEM AND METHOD FOR CONTROLLING THE SAME

(71) Applicant: Samsung Electronics Co., Ltd., Suwon-Si, Gyeonggi-Do (KR)

(72) Inventors: Sang Gon Lee, Seoul (KR); Ki Young Kim, Bucheon-si (KR); Yong Min Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 227 days.

(21) Appl. No.: 14/033,808

(22) Filed: Sep. 23, 2013

(65) Prior Publication Data

US 2014/0239816 A1 Aug. 28, 2014

(30) Foreign Application Priority Data

Feb. 25, 2013 (KR) .......................... 10-2013-0019815

(51) Int. Cl.
*H05B 37/04* (2006.01)
*H05B 33/08* (2006.01)
*H05B 37/02* (2006.01)

(52) U.S. Cl.
CPC ........ *H05B 33/0842* (2013.01); *H05B 37/0272* (2013.01)

(58) Field of Classification Search
None
See application file for complete search history.

(56) References Cited

U.S. PATENT DOCUMENTS

| 7,167,777 | B2 | 1/2007 | Budike, Jr. | |
| 7,845,823 | B2* | 12/2010 | Mueller et al. | 362/231 |
| 2003/0057887 | A1 | 3/2003 | Dowling et al. | |
| 2004/0205189 | A1 | 10/2004 | Sata et al. | |
| 2006/0062582 | A1 | 3/2006 | Suzuki et al. | |
| 2011/0102854 | A1 | 5/2011 | Cho et al. | |
| 2012/0208592 | A1* | 8/2012 | Davis et al. | 455/556.1 |
| 2014/0086590 | A1* | 3/2014 | Ganick et al. | 398/118 |
| 2014/0239852 | A1* | 8/2014 | Kim et al. | 315/312 |
| 2014/0280316 | A1* | 9/2014 | Ganick et al. | 707/769 |
| 2014/0312802 | A1 | 10/2014 | Recker et al. | |

FOREIGN PATENT DOCUMENTS

| JP | 2008181874 A | 8/2008 |
| JP | 2011029053 A | 2/2011 |

(Continued)

OTHER PUBLICATIONS

U.S Office Action dated Oct. 8, 2015 for U.S. Appl. No. 14/030,269.

*Primary Examiner* — Cassandra Cox
(74) *Attorney, Agent, or Firm* — Harness, Dickey & Pierce, PLC

(57) ABSTRACT

Lighting control systems and a method of control the same are provided. For example, the lighting control system includes at least one lighting device transmitting and receiving a wireless communication signal and controlled by a received wireless communication signal, a lighting device authentication code including unique identification information assigned to the lighting device, and a user terminal having an image recognition unit, the user terminal configured to recognize the lighting device authentication code using the image recognition unit, extract the unique identification information from the lighting device authentication code recognized by the image recognition unit, pair the user terminal with the lighting device based on the extracted unique identification information, and control the at least one lighting device.

20 Claims, 24 Drawing Sheets

(56) References Cited

FOREIGN PATENT DOCUMENTS

| | | |
|---|---|---|
| JP | 4725720 B2 | 7/2011 |
| JP | 2011175757 A | 9/2011 |
| JP | 2011175759 A | 9/2011 |
| JP | 4869193 B2 | 2/2012 |
| JP | 2012048909 A | 3/2012 |
| KR | 20030009926 A | 2/2003 |
| KR | 100486528 B1 | 5/2005 |
| KR | 100912039 B1 | 8/2009 |
| KR | 101007235 B1 | 1/2011 |
| KR | 102011009216 A | 8/2011 |
| KR | 102011010312 A | 9/2011 |
| KR | 20120055392 A | 5/2012 |
| KR | 102012006445 A | 6/2012 |
| KR | 101180834 B1 | 9/2012 |
| KR | 102013000387 A | 1/2013 |
| KR | 102013000726 A | 1/2013 |

* cited by examiner

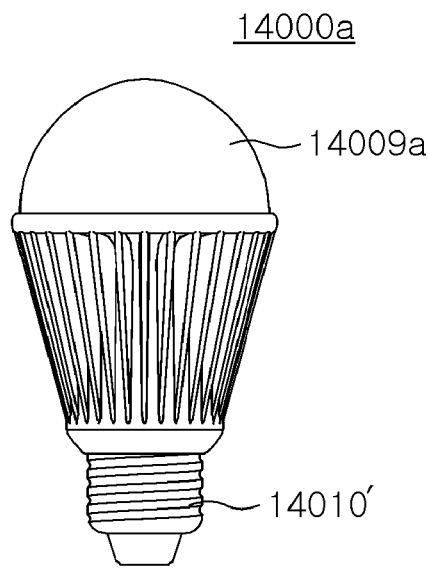
FIG. 5A
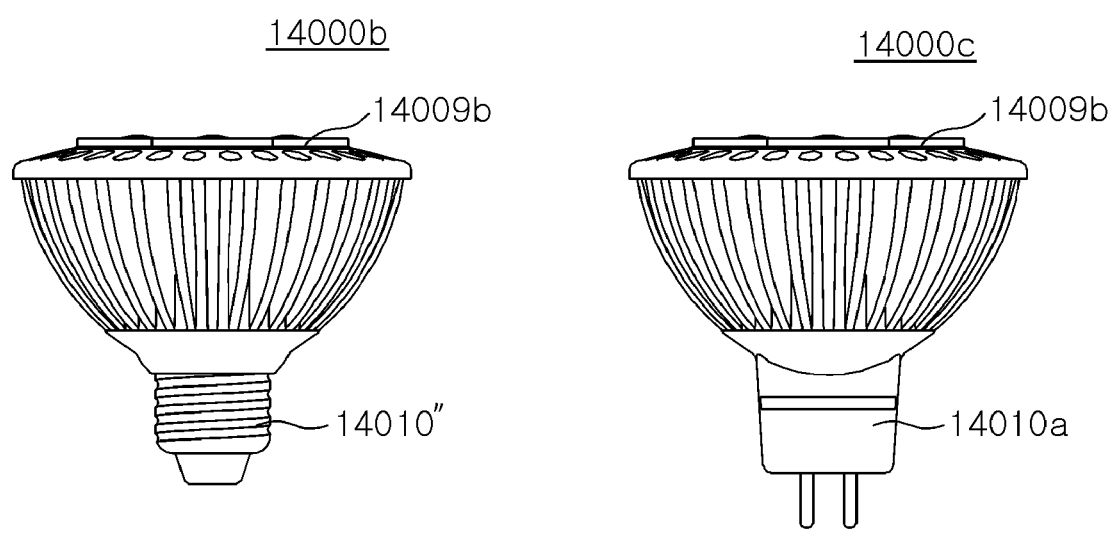
FIG. 5B
FIG. 5C

LIGHTING CONTROL SYSTEM AND METHOD FOR CONTROLLING THE SAME

CROSS-REFERENCE TO RELATED APPLICATIONS

This application claims benefit of priority to Korean Patent Application No. 10-2013-0019815 filed on Feb. 25, 2013, in the Korean Intellectual Property Office, the entire contents of which are hereby incorporated by reference.

BACKGROUND

1. Field

The present inventive concepts relate to lighting control systems and/or methods for controlling the same.

2. Description of the Related Art

In general, incandescent light bulbs or fluorescent lamps are commonly used as indoor and outdoor lighting, but they have relatively short lifespans and thus must be frequently replaced.

In order to address this problem, lighting devices employing a light emitting diode (LED) having improved control characteristics, a relative fast response speed, a relatively high degree of electrophotic conversion efficiency, a relatively long life span, relatively low power consumption, and a relatively high degree of luminosity, have been developed. Because an LED has a relatively high degree of photoelectric conversion efficiency, it consumes less power. Because an LED does not emit light thermally, it does not require a preheating time, thereby exhibiting a relatively fast response time (in other words, it may be quickly turned on and off and on).

Because gas or a filament is not employed, LEDs have various advantages. For instance, LEDs are comparatively more resistant to impacts applied thereto, are safer, may employ a stable direct current (DC) lighting method, which consumes less power, may perform an extended repetitive pulse operation, may reduce optic nerve fatigue, may have a semi-permanent life span, may provide an illumination effect with various colors, and may have a compact configuration when used as a light source. Accordingly, LEDs may reduce the size of downstream products in which they are employed.

User demands for variety in types of lighting are on the rise. For example, beyond a conventional lighting scheme simply providing monochromic illumination having uniform brightness, adjustment functions to provide light of various colors having various degrees of brightness in the same area are being required in illumination devices. Also, beyond a scheme in which a user directly visits a variety of widespread living spaces to control corresponding illumination devices distributed therein, demands for remotely controlling various illumination devices from a location is increasing.

SUMMARY

An aspect of the present inventive concepts provides lighting systems capable of conveniently remotely controlling color and/or brightness of multiple lighting devices from a location.

In one example embodiment, a lighting control system includes at least one lighting device transmitting and receiving a wireless communication signal and controlled by a received wireless communication signal, a lighting device authentication code including unique identification information assigned to the at least one lighting device, and a user terminal including an image recognition unit, the user terminal configured to recognize the lighting device authentication code using the image recognition unit, extract the unique identification information from the lighting device authentication code recognized by the image recognition unit, pair the user terminal with the at least one lighting device based on the extracted unique identification information, and controlling the at least one lighting device.

The unique identification information may include a media access control (MAC) address and a personal identification number (PIN) code of the at least one lighting device.

The PIN code may include a low-order 1-byte value of a value obtained by adding digits of the MAC address.

The lighting device authentication code may be one of a quick response (QR) code and a bar code.

The user terminal may include a camera module imaging the lighting device authentication code, a memory unit storing the extracted unique identification information and/or an application, a wireless communication module transmitting and receiving the wireless communication signal, a terminal controller providing a setting for pairing the user terminal with the lighting device and controlling the lighting device using the application, based on the wireless communication signal, and a display unit outputting driving information regarding the application.

The lighting device may emit white light generated by combining yellow, green, or red phosphors to a blue LED chip and/or by combining green or red LED chips and having two or more peak wavelengths, wherein the white light may be provided in a segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram or provided in a region surrounded by a spectrum of black body radiation and the segment and a color temperature of the white light corresponds to a range from 2,000K to 20,000K.

The lighting device may include a plurality of LED chips having a plurality of nano-scale light emitting structures, and each of the LED chips may include a base layer formed on a substrate. a masking layer formed on the base layer and having a plurality of open regions defined therein for the growth of the plurality of nano-scale light emitting structures, a nano-scale light emitting structure including a first conductivity-type semiconductor nano-core selectively grown on the base layer through the open regions, and an active layer and a second conductivity-type semiconductor layer laminated on a surface of the first conductivity-type nano-core, and first and second ohmic electrodes connected to the first conductivity-type nano-core and the second conductivity-type semiconductor layer, respectively. The first conductivity-type semiconductor nano-core may protrude from the base layer through the open regions.

The lighting device may include an LED chip, wherein the LED chip may include a light emitting structure having including first and second conductivity-type semiconductor layers, the first and second conductivity-type semiconductor layers respectively providing first and second main surfaces, the first and second main surfaces facing one another, an active layer formed between the first and second conductive-type semiconductor layers, a first electrode formed on the second main surface of the light emitting structure and a protrusion of the first electrode passing through the second conductivity-type semiconductor layer and contacting the first conductivity-type semiconductor layer, and a second electrode formed below and connected to the second main surface of the light emitting structure and connected to the second conductivity-type semiconductor layer.

The wireless communication signal may be a signal generated based on a short-range communication technology. The short-range communication technology may be one of Near Field Communication (NFC) and Bluetooth technologies.

In another example embodiment, a method for controlling a lighting control system includes imaging a lighting device authentication code including unique identification information of at least one lighting device, using a user terminal having an image recognition unit, extracting the unique identification information of the lighting device, storing the extracted unique identification information in the user terminal, pairing the user terminal and the at least one lighting device through a wireless communication signal by using the stored unique identification information, and controlling the paired lighting device through the wireless communication signal.

The unique identification information may include a media access control (MAC) address and a personal identification number (PIN) code of the lighting device.

The PIN code may include a low-order 1-byte value of a value obtained by adding all digits of the MAC address.

The extracting of the unique identification information of the at least one lighting device may convert the obtained image into the unique identification information.

The lighting device authentication code may be a quick response (QR) code or a bar code.

The storing the extracted unique identification information in the user terminal may store unique identification information extracted from a plurality of lighting devices under a single name.

The controlling the paired lighting device through the wireless communication signal may control the plurality of lighting devices under the single name simultaneously.

In still another example embodiment, a lighting control system includes an image recognition unit configured to recognize a lighting device authentication code of at least one lighting device, a wireless communication module configured to communicate wirelessly with the at least one lighting device, and a terminal controller configured to extract the unique identification information from the lighting device authentication code, pair the user terminal with the at least one lighting device via wireless communication based on the extracted unique identification information, and control the at least one lighting device.

The lighting control system may further include a memory unit configured to store at least one of an application and input/output data, the terminal controller configured to at least one of extract, pair, and control using the application.

The lighting control system may further include a display unit configured to display at least one of menus of the application for user selections and pairing information.

The unique identification information include a media access control (MAC) address and a personal identification number (PIN) code of the at least one lighting device and the PIN code may include a partial value of a MAC address and a value indicating a type of an individual lighting device.

BRIEF DESCRIPTION OF THE DRAWINGS

The above and other aspects, features and other advantages of the present inventive concepts will be more clearly understood from the following detailed description taken in conjunction with the accompanying drawings, in which:

FIGS. 5A through 5C are views illustrating modifications of a lighting unit employable in the lighting device of the lighting control system of FIG. 1;

DETAILED DESCRIPTION

Figure 1:
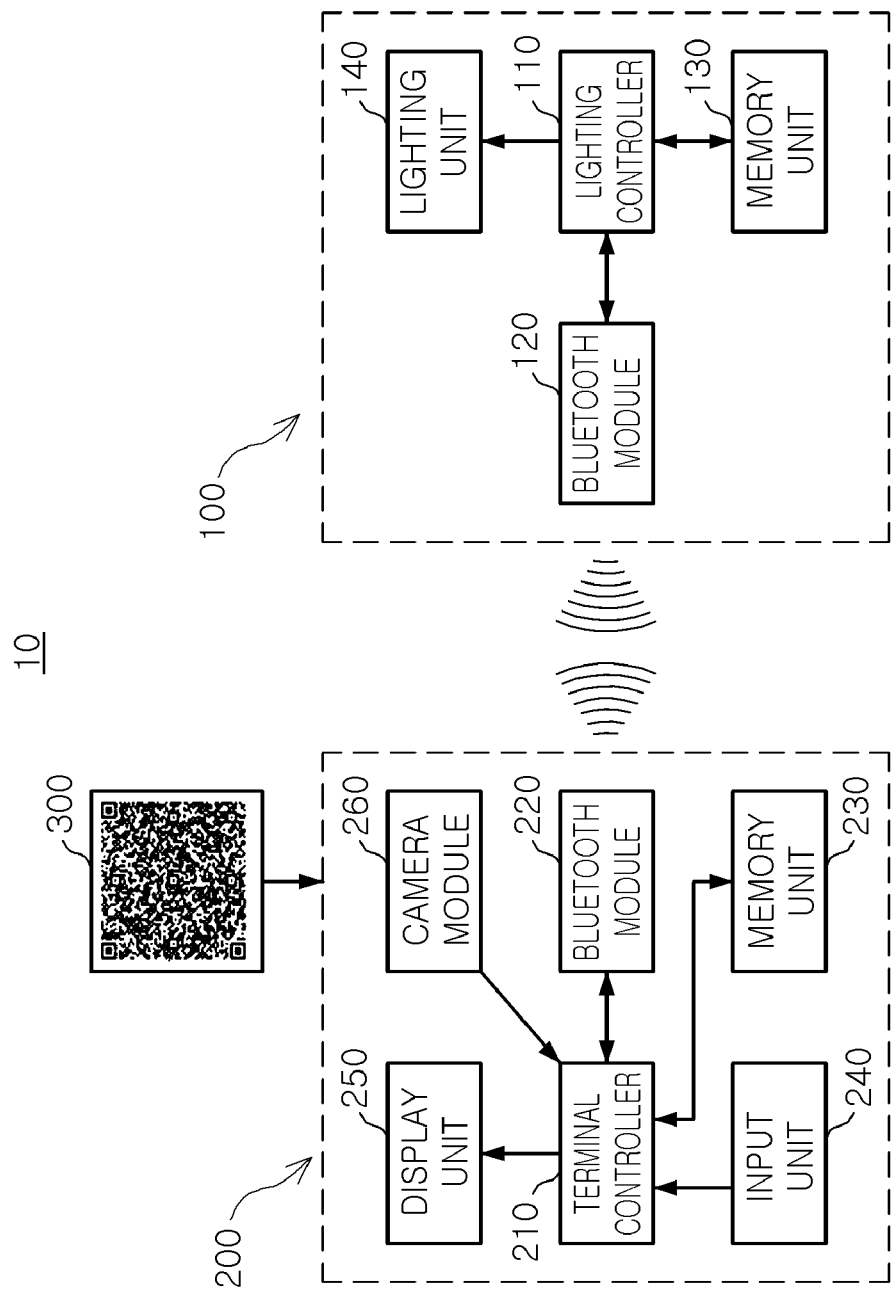
FIG. 1 is a view illustrating a configuration of a lighting control system according to an example embodiment of the present inventive concepts.

Example embodiments of the present inventive concepts will now be described in detail with reference to the accompanying drawings. The present inventive concept may, however, be embodied in many different forms and should not be construed as being limited to the embodiments set forth herein. Rather, these embodiments are provided so that this disclosure will be thorough and complete, and will fully convey the scope of the present inventive concepts to those skilled in the art. In the drawings, the shapes and dimensions of elements may be exaggerated for clarity, and the same reference numerals will be used throughout to designate the same or like components.

In the present disclosure, spatial terms such as 'upper portion', 'upper surface', 'lower portion', 'lower surface', 'lateral surface', etc., are determined based on the drawings, and in actuality, the terms may be changed according to directions in which respective components are disposed.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a view illustrating a configuration of a lighting control system according to an example embodiment of the present inventive concepts. As illustrated in FIG. 1, a lighting control system 10 includes a lighting device 100, a user terminal 200, and a lighting device authentication code 300.

The lighting device 100 may be controlled via a short-range wireless communications network. For example, Bluetooth™ technology may be used to facilitate a short-range wireless communications network.

The lighting device 100 may include a lighting controller 110, a Bluetooth module 120, a memory unit 130, and a lighting unit 140. A plurality of lighting devices 100 may be provided. The lighting controller 110, the Bluetooth module 120, and the memory unit 130 may be configured as a single body with the lighting unit 140, or may be configured as a separate unit coupled to the lighting unit 140.

The lighting controller 110 may process a wireless data signal received via the Bluetooth module 120, store the processed data signal in the memory unit 130, and control the lighting unit 140 based on the data signal stored in the memory unit 130.

Any light emitting unit may be used as the lighting unit 140 as long as it emits light when an electrical signal is applied thereto. For example, a light emitting diode (LED) may be used as the lighting unit 140. Here, at least one LED may be provided. The lighting unit 140 may change at least one of a color, a color temperature, brightness, and a chroma of emitted light, by using the lighting controller 110.

Hereinafter, various lighting units 140 employable in the present example embodiments will be described with respect to examples in which the lighting unit 140 is separately provided from the lighting controller 110, the Bluetooth module 120, and the memory unit 130.

Lighting Unit

First Example

Figure 3:
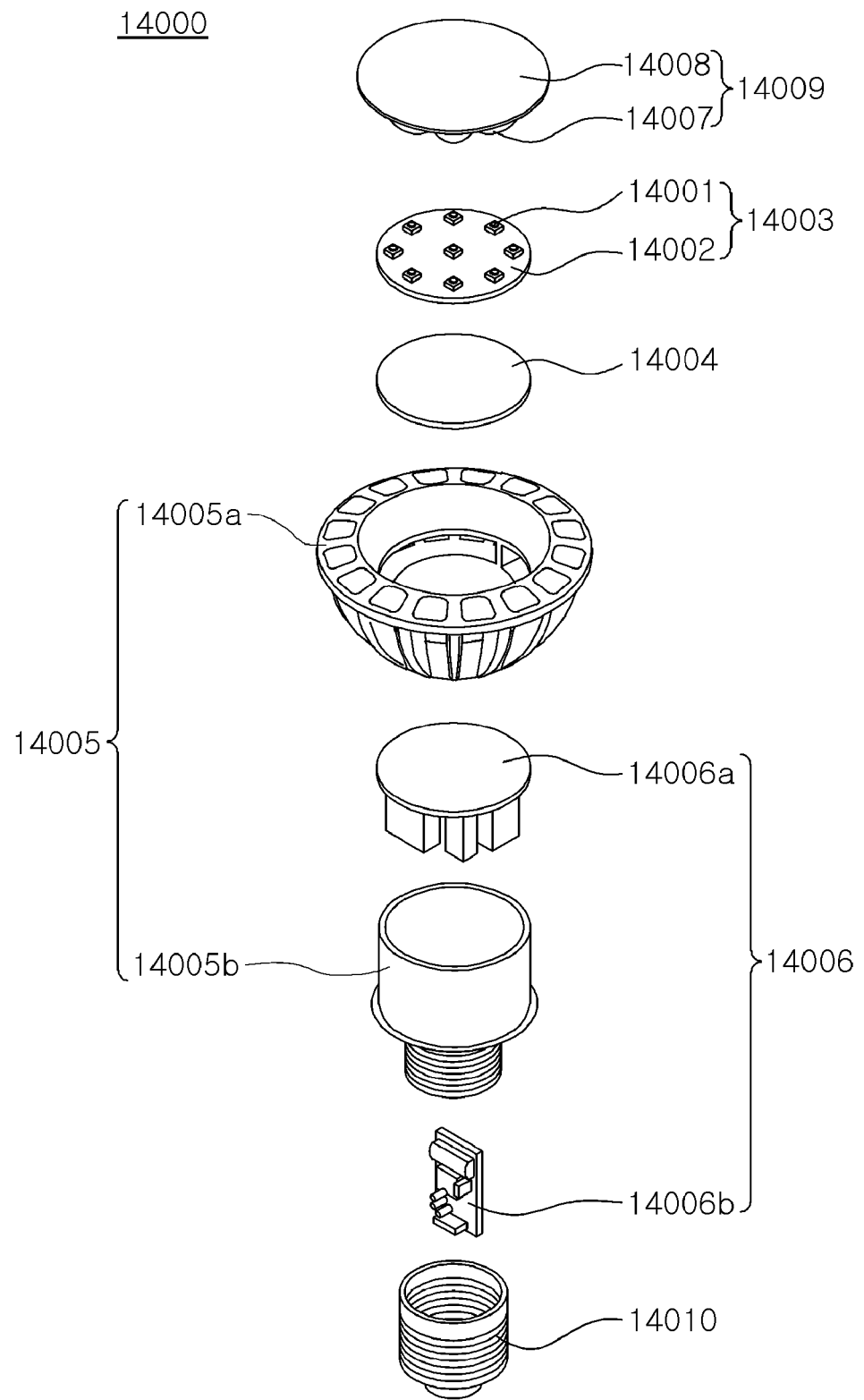
FIG. 3 is an exploded perspective view schematically illustrating an example embodiment of a lighting unit employable in a lighting device of the lighting control system of FIG. 1.

As illustrated in FIG. 3, a lighting unit 14000 (an example embodiment of the lighting unit 140 of FIG. 1) includes a light source unit 14003, heat dissipation units 14004 and 14005 (including 14005a and 14005b), a power unit 14006 (including 14006a and 14006b), an optical unit 14009, and a base unit 14010.

The light source unit 14003 may have a light emitting device 14001 and a circuit board 14002 on which the light emitting device 14001 is mounted.

The circuit board 14002 may be an FR type printed circuit board (PCB), and may be formed of an organic resin material containing epoxy, triazine, silicon, polyimide, etc., or any other organic resin material, or formed of a ceramic material such as silicon nitride, AlN, $Al_2O_3$, or the like, or a metal or a metal compound. The circuit board 14002 may include a metal core printed circuit board (MCPCB), a metal copper clad laminate (MCCL), or the like.

Hereinafter, various circuit board structures that may be employed in the present example embodiments will be described.

Figure 7:
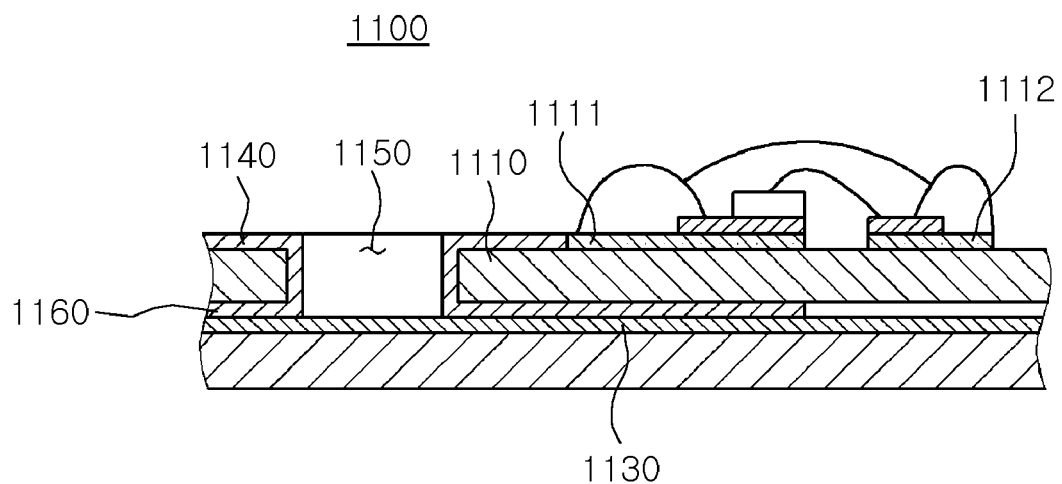
FIG. 7 is a cross-sectional view schematically illustrating an example embodiment of a circuit board employable in a light source unit in FIG. 3.

Referring to FIG. 7, a circuit board 1100 employable in the present example embodiments may include an insulating substrate 1110 having desired (or, alternatively predetermined) circuit patterns 1111 and 1112 formed on one surface thereof, an upper thermal diffusion plate 1140 formed on the insulating substrate 1110 such that the upper thermal diffusion plate 1140 is in contact with the circuit patterns 1111 and 1112, and dissipates heat generated by the light emitting device 14001; and a lower thermal diffusion plate 1160 formed on the other surface of the insulating substrate 1110 and transmitting heat transmitted from the upper thermal diffusion plate 1140 outwardly. The upper thermal diffusion plate 1140 and the lower thermal diffusion plate 1160 may be connected to and exchange heat with each other via at least one through hole 1150, which penetrates through the insulating substrate 1110 and has inner walls plated with a heat-conductive material. Inner walls of the insulating substrate 110 may be plated to conduct or transfer heat between the upper thermal diffusion plate 1140 and the lower thermal diffusion plate 1160.

In the insulating substrate 1110, the circuit patterns 1111 and 1112 may be formed by cladding a ceramic with copper or epoxy resin-based FR4 and performing an etching process thereon. An insulating thin film 1130 may be formed by coating an insulating material on a lower surface of the substrate 1110.

Figure 8:
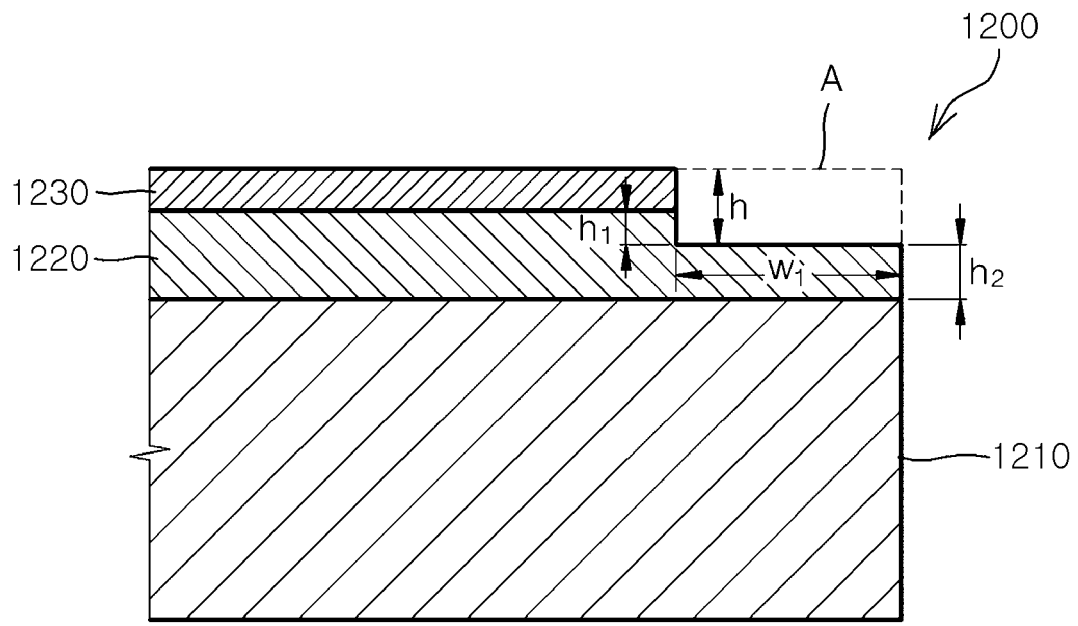
FIG. 8 is a cross-sectional view schematically illustrating an example embodiment of a substrate employable in FIG. 7.

FIG. 8 illustrates another example embodiment of a substrate, e.g., a metal substrate. As illustrated in FIG. 8, a substrate 1200 includes a first metal layer 1210, an insulating layer 1220 formed on the first metal layer 1210, and a second metal layer 1230 formed on the insulating layer 1220. A step region 'A' exposing the insulating layer 1220 may be formed in at least one end portion of the substrate 1200.

The first metal layer 1210 may be made of a material having excellent exothermic characteristics. For example, the first metal layer 1210 may be made of a metal such as aluminum (Al), iron (Fe), or the like, or an alloy thereof. The first metal layer 1210 may have a unilayer structure or a multilayer structure. The insulating layer 1220 may be made of a material having insulating properties, and may be formed of an inorganic material or an organic material. For example, the insulating layer 1220 may be made of an epoxy-based insulating resin, and may include metal powder such as aluminum (Al) powder, or the like, in order to enhance thermal conductivity. The second metal layer 1230 may be formed of, e.g., a copper (Cu) thin film.

As illustrated in FIG. 8, in the metal substrate according to this example embodiment, an insulation length, which is defined as an exposure width W1 of the insulating layer 1220 exposed at, for instance, one end portion of the insulating layer 1220, may be greater than a thickness of the insulating layer 1220. In other words, the insulation length refers to a length of the insulating layer 1220 exposed between the first metal layer 1210 and the second metal layer 1230. When the metal substrate 1200 is viewed from above, a width of the exposed region of the insulating layer 1220 is the exposure width W1. The region 'A' in FIG. 8 is removed through a grinding process, or the like, during the manufacturing process of the metal substrate. The second metal layer 1230 and the insulating layer 1120 may be removed to a depth 'h' downwardly from a surface of the second metal layer 1230 to expose the insulating layer 1220 by the exposure width W1, thereby forming a step structure. If the end portion of the metal substrate 1200 is not removed, the insulation length may be equal to a thickness h1+h2 of the insulating layer 1220. By removing a portion of the end portion of the metal substrate 1220, an insulation length equal to approximately W1 may be additionally secured. Thus, when a withstand voltage of the metal substrate 1200 is tested, the likelihood of an electrical shortage between the two metal layers 1210 and 1230 at the end portions thereof may be minimized or prevented.

Figure 9:
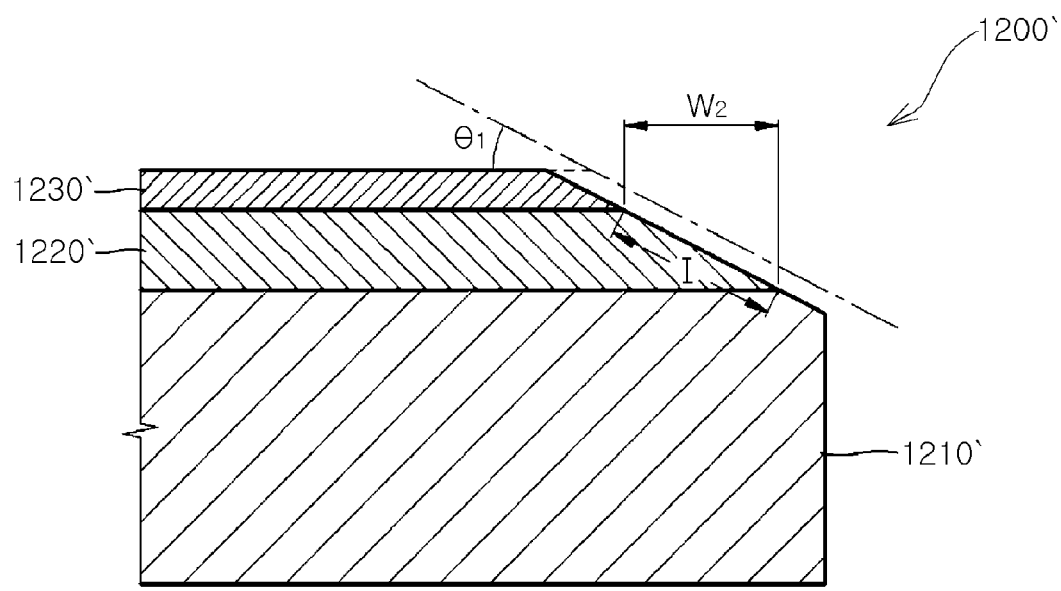
FIG. 9 is a cross-sectional view schematically illustrating a modification of the substrate of FIG. 8.

FIG. 9 is a view schematically illustrating a metal substrate structure according to a modification of FIG. 8. Referring to FIG. 9, a metal substrate 1200' includes a first metal layer 1210', an insulating layer 1220' formed on the first insulating layer 1220', and a second metal layer 1230' formed on the insulating layer 1220'. The insulating layer 1220' and the second metal layer 1230' include regions removed at a desired (or, alternatively predetermined) angle of inclination θ1, and the first metal layer 1210' may also include a region removed at the desired (or, alternatively predetermined) angle of inclination θ1.

The angle of inclination θ1 may be an angle between the upper surface of the insulating layer 1220' (or alternatively, the bottom surface of the second metal layer 1230') and the inclined side surface of the insulating layer 1220'. The angle of inclination θ1 may be selected to secure a desired insulation length I in consideration of a thickness of the insulating layer 1220'. The inclination angle θ1 may be selected within the range of 0<θ1<90 (degrees). As the inclination angle θ1 decreases, the insulation length I and a projected width W2 of the exposed region of the insulating layer 1220' increases. Thus, in order to secure a larger insulation length, the inclination angle θ1 may be selected to be smaller. For example, the inclination angle may be selected within the range of 0<θ1≤45 (degrees).

Figure 10:
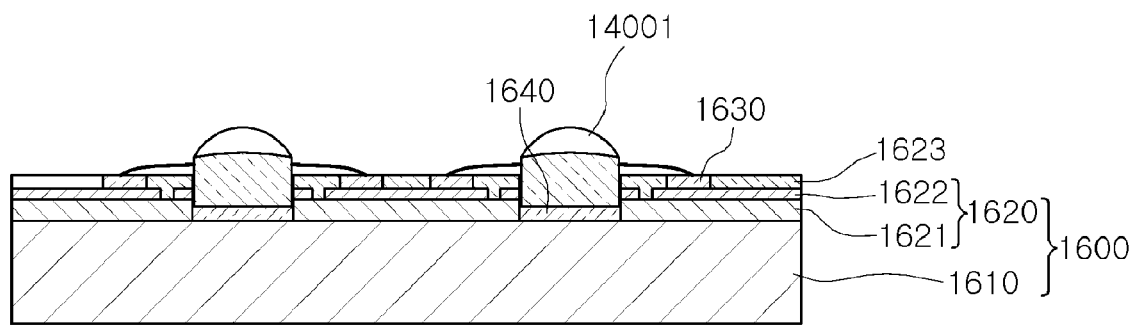
FIGS. 10 through 13 are cross-sectional views schematically illustrating various examples of the circuit board.

FIG. 10 schematically illustrates another example embodiment of the circuit board. Referring to FIG. 10, a substrate 1600 includes a metal support substrate 1610 and resin-coated copper (RCC) 1620 formed on the metal support substrate 1610. The RCC 1620 may include an insulating layer 1621 and a copper foil 1622 laminated on the insulating layer 1621. A portion of the RCC 1620 may be removed to form at least one recess in which the light emitting device 14001 may be installed. The metal substrate 1600 may have a structure in which the RCC 1620 is partially removed to accommodate the light emitting device 14001 and the light emitting device 14001 is in direct contact with the metal support substrate 1610. Thus, heat generated by the light emitting device 14001 may be directly transmitted to the metal support substrate 1610, thereby enhancing heat dissipation. The light emitting device 14001 may be electrically connected to the metal support substrate 1610, and the solders 1630 and 1640 may attach the light emitting device 14001 to the metal support substrate 1610. A protective layer 1623 made of a liquid photo solder resist (PSR) may be formed on an upper portion of the copper foil 1622.

Figure 11A:
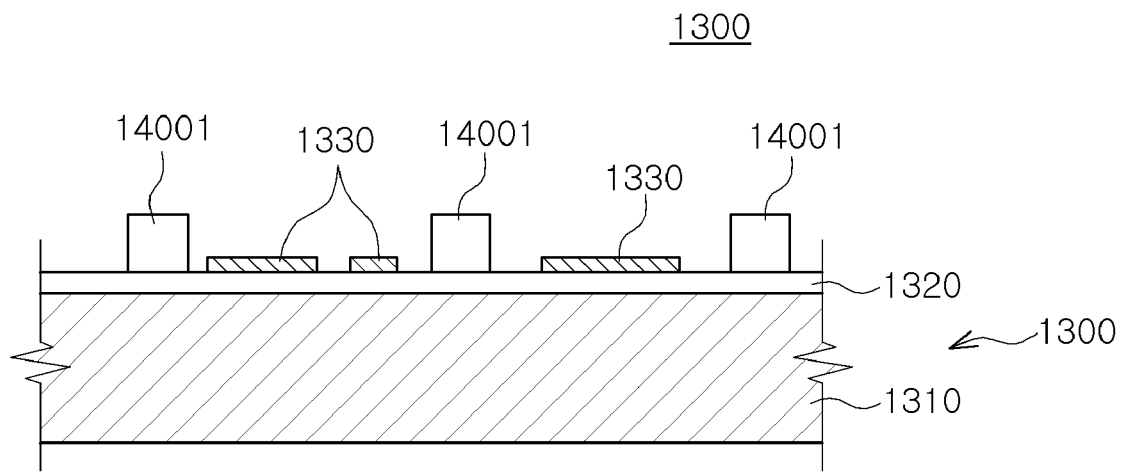
Figure 11B:
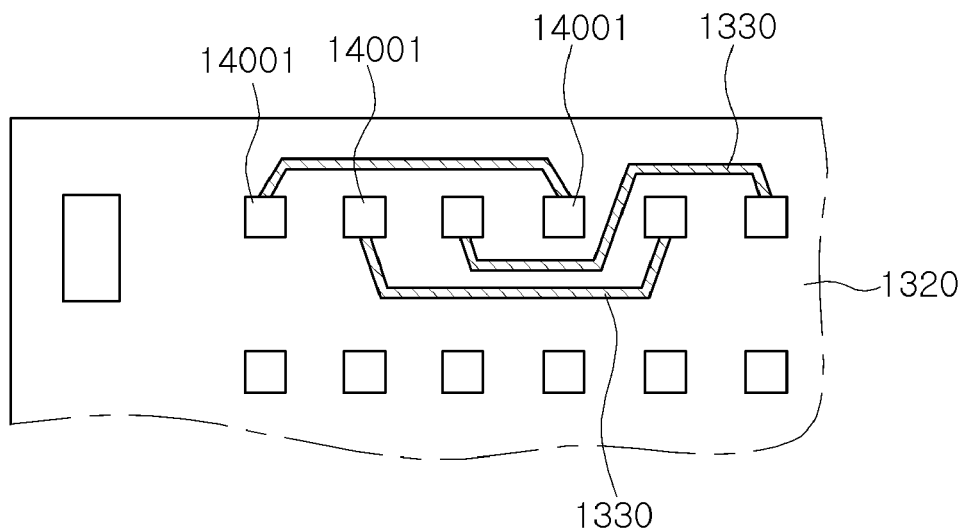

FIGS. 11A and 11B schematically illustrate another example embodiment of the circuit board. The circuit board according to this embodiment includes an anodized metal substrate having improved heat dissipation characteristics and incurring lower manufacturing costs. Referring to FIG. 11A, the anodized metal substrate 1300 may include a metal plate 1310, an anodic oxide film 1320 formed on the metal plate 1310, and electrical wirings 1330 formed on the anodic oxide film 1320. The light emitting device 14001 may be mounted on the anodic oxide film 1320, and may be electrically connected to the electrical wirings 1330.

The metal plate 1310 may be made of aluminum (Al) or an Al alloy that may be easily obtained at a lower cost. The metal plate 1310 may be made of any other anodizable metal, for example, a material such as titanium (Ti), magnesium (Mg), etc.

The anodic oxide film 1320 may be formed of aluminum oxide film ($Al_2O_3$) obtained by anodizing, as aluminum has a relatively high heat transmission characteristics ranging from about 10 W/mK to 30 W/mK. Thus, the circuit board 1300 including the anodized metal substrate may have better heat dissipation characteristics than conventional polymer substrates, e.g., a PCB, or an MCPCB.

Figure 12:
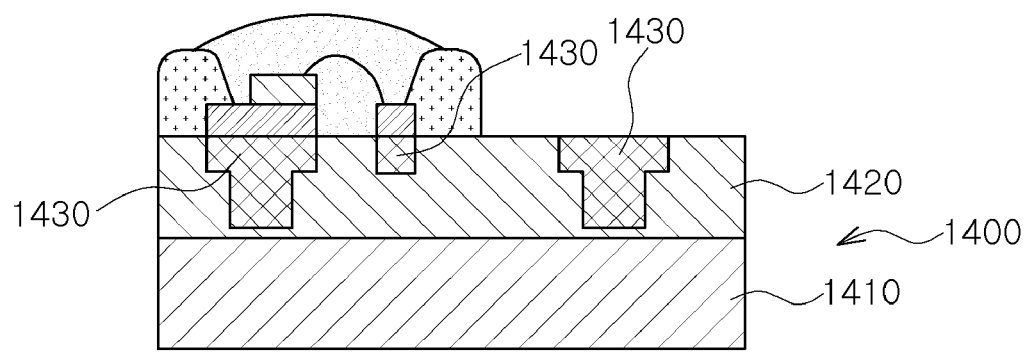

FIG. 12 schematically illustrates another example embodiment of the circuit board. As illustrated in FIG. 12, the circuit board 1400 may include a metal substrate 1410, an insulating resin 1420 coated on the metal substrate 1410, and a circuit pattern 1430 formed on the insulating resin 1420. For example, the insulating resin 1420 may have a thickness equal to or less than 200 μm. The insulating resin 1420 may be laminated on the metal substrate 1410 in the form of a solid film or may be coated in the liquid form using a spin coating or a blade application process. Also, the circuit pattern 1430 may be formed by filling a metal such as copper (Cu), or the like, in a circuit pattern intaglioed or engraved into the insulting layer 1420. The light emitting device 14001 may be mounted to be electrically connected to the circuit pattern 1430.

Figure 13:
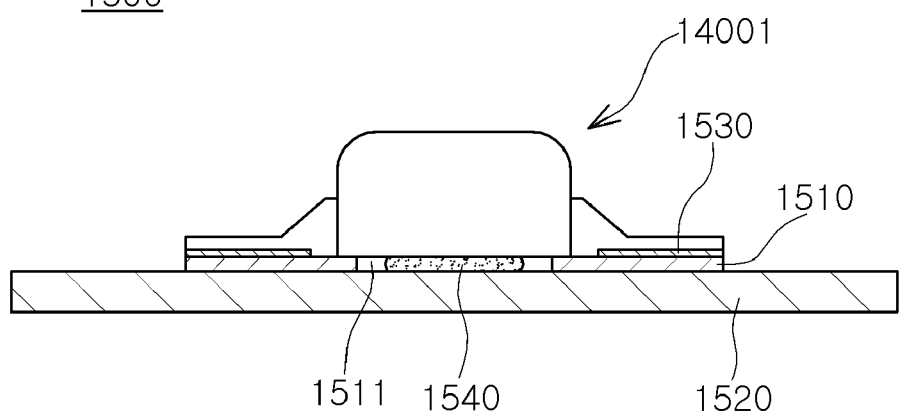

The circuit board may include a flexible PCB (FPCB) that can be easily deformed. As illustrated in FIG. 13, a circuit board 1500 may include a flexible circuit board 1510 having one or more through holes 1511, and a support substrate 1520 on which the flexible circuit board 1510 is mounted. A heat dissipation adhesive 1540 may be provided in the through hole 1511 to couple a lower surface of the light emitting device 14001 and an upper surface of the support substrate 1520. Here, the lower surface of the light emitting device 14001 may be a lower surface of a chip package, a lower surface of a lead frame having an upper surface on which a chip is mounted, or a metal block. A circuit wiring 1530 may be formed on the flexible circuit board 1510 and electrically connected to the light emitting device 14001.

When the flexible circuit board 1510 is used, thickness and/or weight of the circuit board 1500 may be reduced, and thus manufacturing costs also may be reduced. Because the light emitting device 14001 is directly bonded to the support substrate 1520 by the heat dissipation adhesive 1540, heat dissipation efficiency in dissipating heat generated by the light emitting device 14001 can be increased.

The circuit board 14002 illustrated in FIG. 3 may have a flat circular plate shape, but the present inventive concepts are not limited thereto. For example, the circuit board 14002 may have a square shape or any other polygonal shape.

The plurality of light emitting devices 14001 may be mounted on the circuit board 14002 and electrically connected thereto. Each of the light emitting devices 14001, types of semiconductor device generating light having a desired (or, alternatively predetermined) wavelength by power applied from the outside, may include a light emitting diode (LED). The light emitting device 14001 may emit blue light, green light, or red light according to a material or materials contained therein, or may emit white light.

The heat dissipation units 14004 and 14005 may include an internal heat dissipation unit 14004 and an external heat dissipation unit 14005. The internal heat dissipation unit 14004 may be disposed to be directly connected to the light source unit 14003 and/or the power unit 14006 to transmit heat to the external heat dissipation unit 14005.

The power unit 14006 may convert alternating current (AC) power (100V to 240V) supplied through the base unit 14010 into AC or DC power appropriate for lighting (or turning on) the light source unit 14003 and supply the same. The power unit 14006 may be integrally configured with the circuit board 14002 of the light source unit 14003 or may be configured as a separated unit by using a separate circuit board.

When the power unit 14006 is disposed as an integral type (e.g., one body type integrated with the circuit board 14002), the power unit 14006 may have a simple structure to reduce manufacturing costs. In this case, however, even if only the power unit 14006 is damaged, the whole integrated body including the power unit 14006 and the circuit board 14002 needs to be replaced, thereby increasing maintenance costs.

However, when the power unit 14006 is separately disposed from the circuit board 14002, the lighting unit may have a complicated structure, relative to an integral type, and thus manufacturing costs may increase. However, in the event that the power unit 14006 is damaged, maintenance costs may be reduced because the power unit 14006 can be separately replaced.

The optical unit 14009 may be a lens-type structure capable of adjusting a path of light emitted from the light emitting device 14001. The optical unit 14009 may include an internal optical unit 14007 primarily adjusting light emitted from the light emitting unit 14001 and an external optical unit 14008 installed around the internal optical unit 14007.

The base unit 14010 may be configured to have a thread compatible with a base of an existing light bulb, so that it can be coupled to a socket of an existing light bulb.

Lighting Unit

Second Example

Figure 4A:
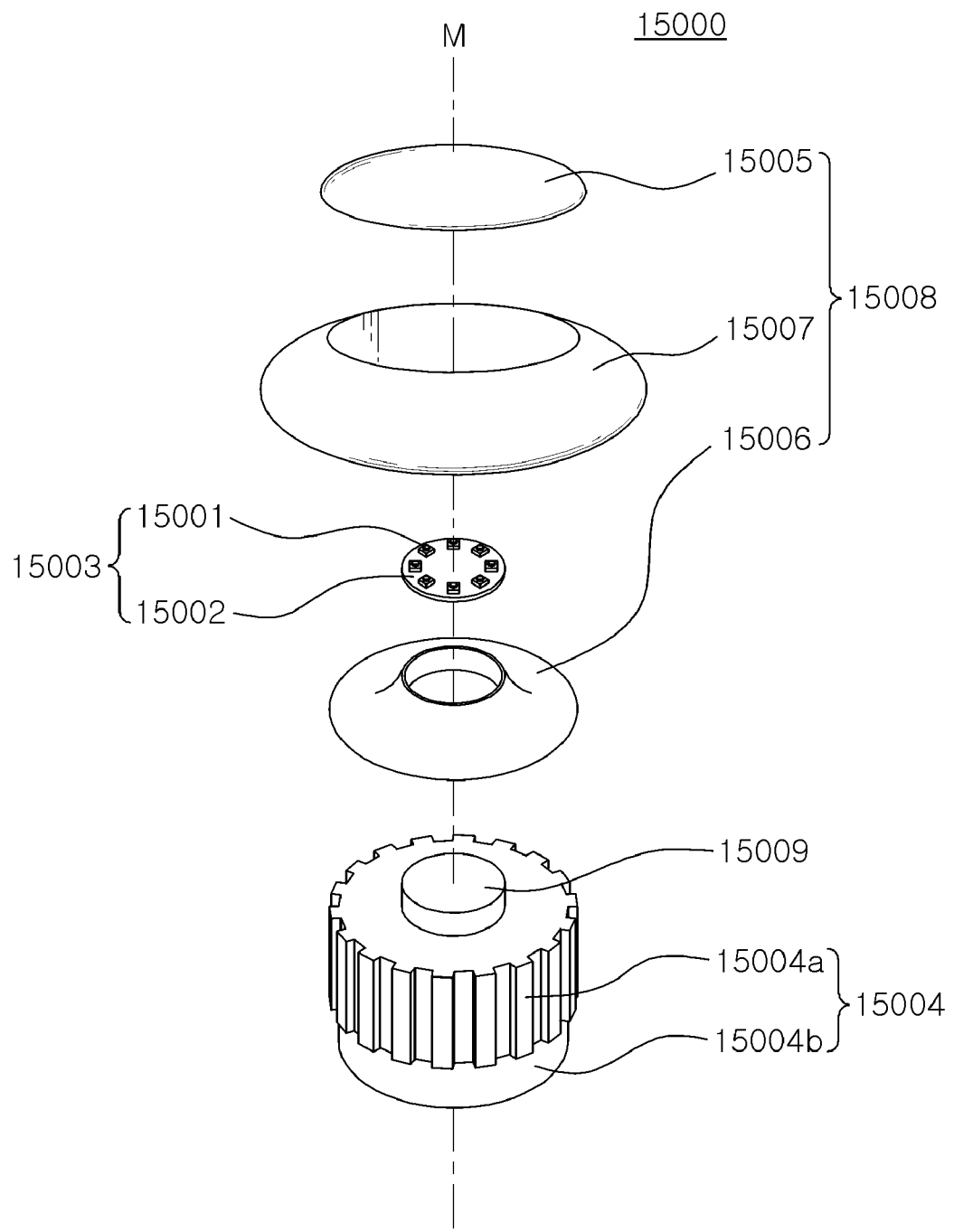
FIG. 4A is an exploded perspective view schematically illustrating another example embodiment of a lighting unit employable in the lighting device of the lighting control system of FIG. 1.

As illustrated in FIG. 4A, a lighting unit 15000 according to another embodiment of the present inventive concepts has the same or a similar structure as that of the example embodiment of FIG. 3, except for an optical unit 15008. Accordingly, the optical unit 15008 will be described in detail.

Figure 4B:
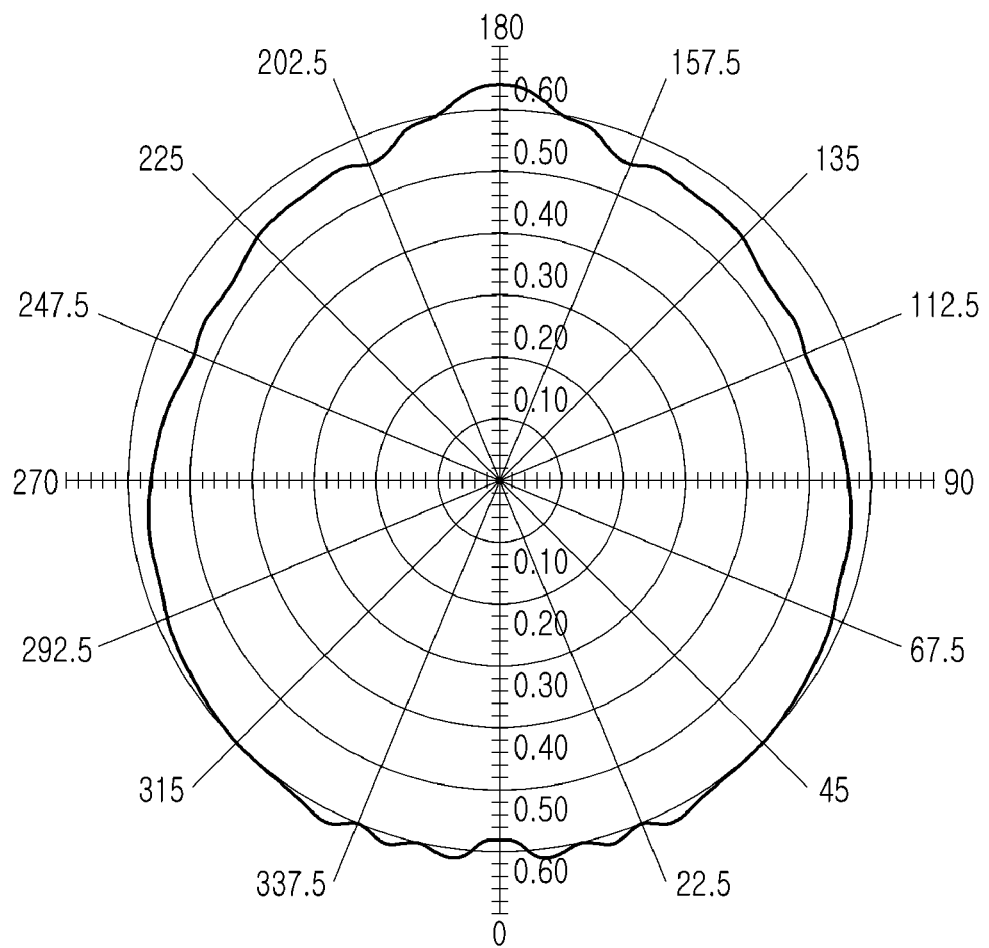
FIG. 4B is a view illustrating light distribution curves of the lighting unit of FIG. 4A.

FIG. 4A is an exploded perspective view schematically illustrating another example embodiment of a lighting unit employable in the lighting device of the lighting control system of FIG. 1, and FIG. 4B is a view illustrating light distribution curves of the lighting unit of FIG. 4A.

The optical unit 15008 may include a first reflective unit 15005 and a second reflective unit 15006.

The first reflective unit 15005 may be disposed to face a light source unit 15003 to reflect light emitted from a light emitting device 15001 of the light source unit 15003. The first reflective unit 15005 may have a disk-like shape and may have a reflective surface formed on a lower surface thereof to reflect light emitted from the light source unit 15003. The reflective surface of the first reflective unit 15005 may be a flat surface or a curved surface and may be larger than the light source unit 15003.

The second reflective unit 15006 may be a region re-reflecting light reflected from the first reflective unit 15005. The second reflective unit 15006 may have a shape corresponding to the first reflective unit 15005 and may be disposed in a peripheral region of the light source unit 15003. The second reflective unit 15006 may have a curved surface sloped downward away from the light source unit 15003.

For example, the first reflective unit 15005 may be disposed above the light source unit 15003, and the second reflective unit 15006 may be disposed below the light source unit 15003.

At least one of the first reflective unit 15005, the light source unit 15003, and the second reflective unit 15006 may be symmetrical with respect to a central axis M of the lighting unit 15000. Also, the light source unit 15003 may include a plurality of light emitting devices 15001 disposed to be spaced apart from the central axis M of the lighting unit 15000 by a desired (or, alternatively predetermined) interval.

The light source unit 15003 may further include a cover encapsulating an internal space in which the light source unit 15003 is disposed. The cover 15007 may have a tube-like shape penetrating upper and lower portions thereof to connect the first reflective portion 15005 and the second reflective portion 15006. For example, one end of the second reflective portion 15006 may be in contact with the light source unit 15003 and the other end thereof may be in contact with the cover 15007. Also, one end of the cover 15007 may be in contact with the first reflective portion 15005 and the other end thereof may be in contact with the second reflective portion 15006.

Reflective pigment may be coated on an internal region of the cover 15007 to form a reflective portion.

A support unit 15009 may be formed on the heat releasing unit 15004 to support the optical unit 15008. The support unit 15009 may be configured to be the same, in terms of shape and functions as those of the second reflective unit 15006, and thus may replace the second reflective unit 15006.

A light distribution curve of the lighting unit 15000 will be described with reference to FIG. 4B. The solid line in FIG. 4B denotes an irradiation angle of the lighting unit 15000, and it can be seen that light is irradiated uniformly in all directions (360 degrees). It means that the irradiation angle is significantly enhanced, in comparison to the irradiation angle (130 degrees) of light sources in the conventional art.

As illustrated in FIGS. 5A through 5C, the lighting unit 14000 of FIG. 3 may be various bulb-type lamps using LEDs. FIG. 5A illustrates an example lighting unit 14000*a* having an optical unit 14009*a* with a hemispherical shape. Light passing through the optical unit 14009*a* may generate a small amount of dazzle (glare) and be evenly spread vertically and horizontally. FIG. 5B illustrates an example lighting unit 14000*b* having a flat optical unit 14009*b*. FIG. 5C illustrates an example lighting unit 14000*c* having a pin-type base unit 14010*a*.

Lighting Unit

Third Example

Figure 6A:
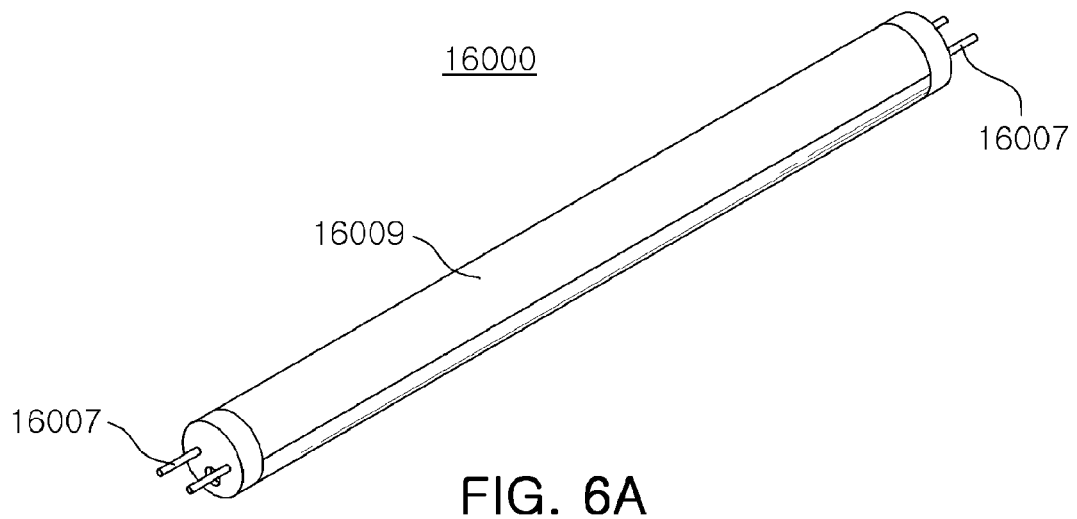
FIGS. 6A and 6B are perspective views schematically illustrating modifications of the lighting unit employable in the lighting device of the lighting control system of FIG. 1.
Figure 6B:
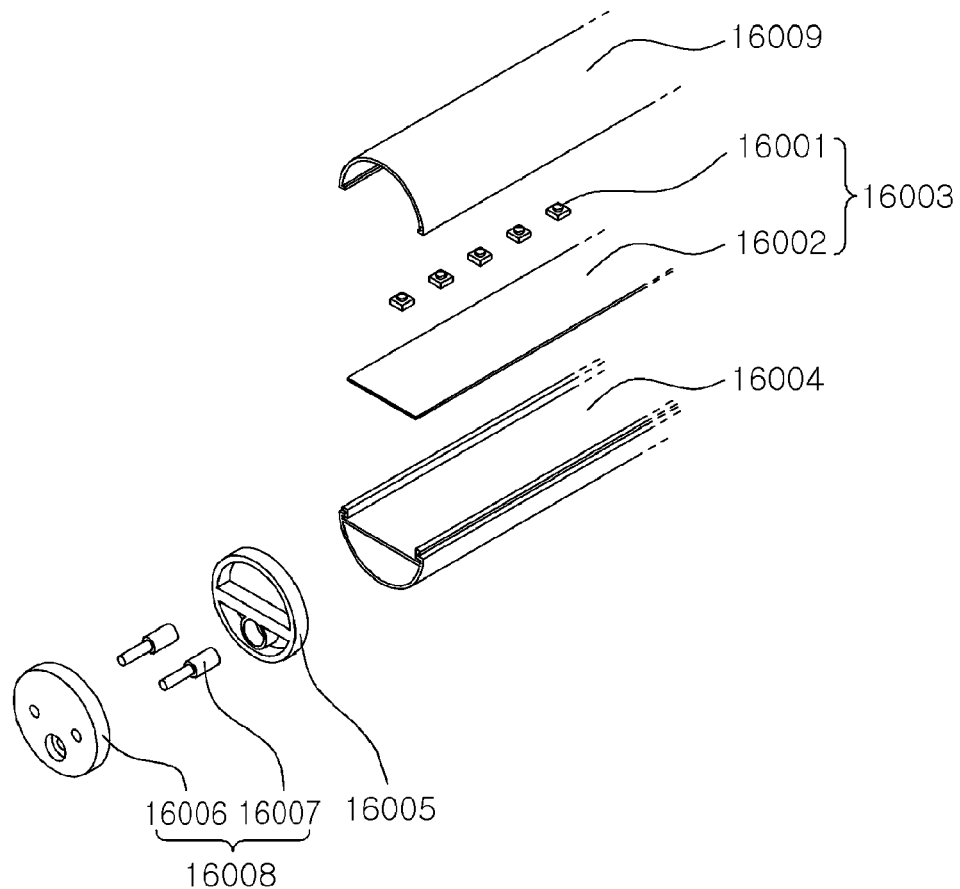

As illustrated in FIGS. 6A and 6B, the lighting unit 14000 of FIG. 3 may be configured as a fluorescent lamp 16000, rather than the foregoing bulb-type lamp.

The fluorescent LED lamp 16000 (also as known as an LED-tube) may be installed in an existing fluorescent lamp socket and used. Similar to the bulb-type lamps as described above, the fluorescent LED lamp 16000 may include a light source unit 16003, a heat dissipation unit 16004, a power unit (not shown), an optical unit 16009, and a base unit 16008.

The light source unit 16003 includes a circuit board 16002 and a plurality of light emitting devices 16001 mounted on the circuit board 16002.

The heat dissipation unit 16004 may have an elongated bar-type shape, corresponding to the shape of the circuit board 16002 such that the light source unit 16003 is installed on one surface of the circuit board 16002 in a fixed manner. The heat dissipation unit 16004 may be formed of a material having a relatively high heat conductivity to dissipate heat generated by the light source unit 16003 outwardly. For example, the heat dissipation unit 16004 may be made of metal, but the present inventive concepts are not limited thereto.

Both end portions of the heat dissipation unit 16004 may be open in a length direction thereof. For example, the heat dissipation unit 16004 may have a pipe-type structure in which both end portions thereof are open. Referring to FIG. 6B, the structure in which both end portions of the heat dissipation unit 16004 are open is illustrated, but the present inventive concepts are not limited thereto. For example, only one of the two end portions of the heat dissipation unit 16004 may be open.

The base unit 16008 may be provided in at least one of the two opened end portions of the heat dissipation unit 16004 in the length direction and supply power to the light source unit 16003 from the outside. Although the present example embodiment illustrates that both end portions of the heat dissipation unit 16004 are open and the base unit 16008 is provided in both end portions of the heat dissipation unit 16004, the present inventive concepts are not limited thereto and in a case of a structure in which only one side is open, the base unit 16008 may be provided in the only one side.

The base unit 16008 may be fastened to the opened both end portions of the heat dissipation unit 16008, respectively to cover them. The base unit 16008 may include an outwardly protruded electrode pin 16007 and a body 16006 to which the pin 16007 is coupled. For example, the base unit 16008 may be fastened to both end portions of the heat dissipation unit 16004 through an adapter 16005. When the lighting unit 16000 is installed in a fluorescent lamp socket, the base unit 16008 may be electrically connected thereto through the electrode pin 16007 to supply power to the light source unit 16003.

The optical unit 16009 may be fastened to the heat dissipation unit 16004 to cover the light source unit 16003. The optical unit 16009 may be made of a light transmitting material. The optical unit 16009 may have a semi-circular curved surface to allow light to be uniformly irradiated outwardly.

In the present example embodiment, the optical unit 16009 is illustrated to have a semi-circular curved shape, but the present inventive concepts are not limited thereto. For example, the optical unit 16009 may have a flat quadrangular structure or any other polygonal structure. The configuration of the optical unit 16009 may be variously modified according to illumination designs for irradiating light.

Hereinafter, various light emitting devices according to example embodiments of the present inventive concepts, which are employable in the lighting unit 140 of the lighting device 100, will be described.

Light Emitting Device

First Example

Figure 14:
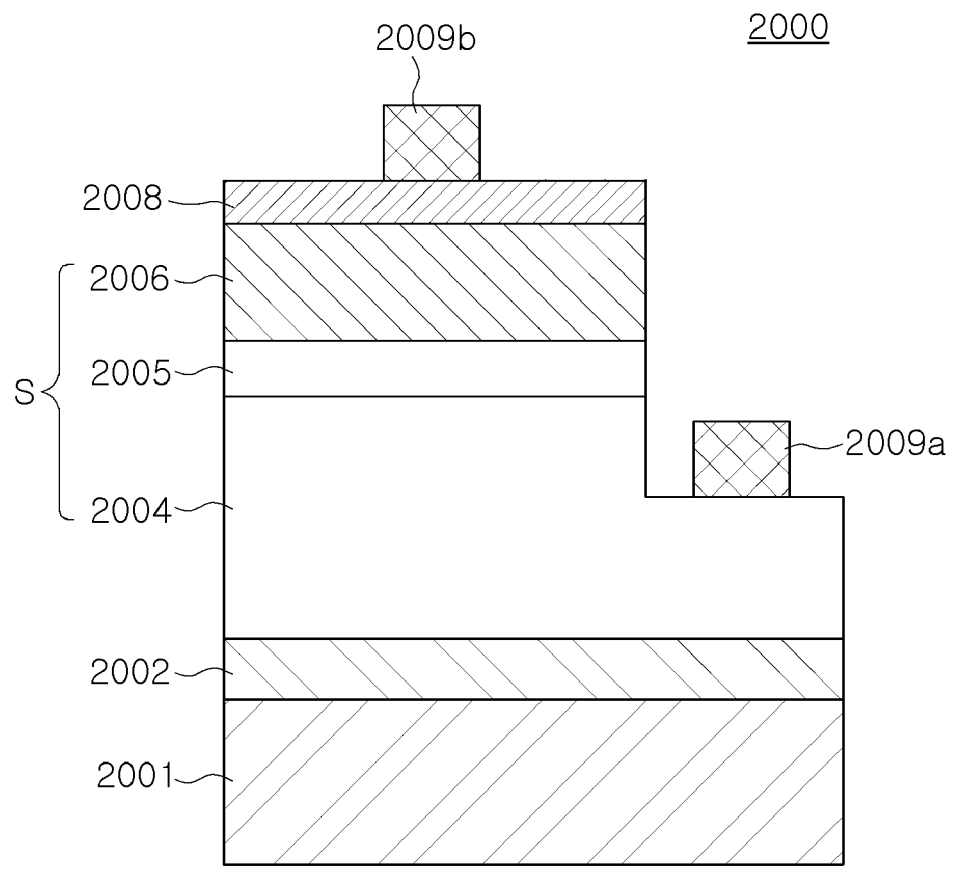
FIG. 14 is a cross-sectional view schematically illustrating an example embodiment of a light emitting device employable in the lighting unit in FIG. 3.

FIG. 14 is a cross-sectional view schematically illustrating an example embodiment of a light emitting device employable in the lighting unit in FIG. 3.

As illustrated in FIG. 14, a light emitting device 2000, which is one embodiment of the light emitting device 14001 in FIG. 3, may include a light emitting laminate S formed on a substrate 2001. The light emitting laminate S may include a first conductivity-type semiconductor layer 2004, an active layer 2005, and a second conductivity-type semiconductor layer 2006.

An ohmic contact layer 2008 may be formed on the second conductivity-type semiconductor layer 2006, and first and second electrodes 2009*a* and 2009*b* may be formed on upper surfaces of the first conductivity-type semiconductor layer 2004 and the ohmic contact layer 2008, respectively.

Hereinafter, major components of the light emitting device will be described.

[Substrate]

The substrate 2001 may be a growth substrate for epitaxial growth. For example, the substrate 2001 may be an insulating substrate, a conductive substrate, or a semiconductor substrate. For example, sapphire, SiC, Si, $MgAl_2O_4$, MgO, $LiAlO_2$, $LiGaO_2$, or GaN may be used as a material of the substrate 2001. For epitaxial growth of a GaN material, a GaN substrate (e.g., a homogeneous substrate) may be desirable, but the GaN substrate incurs high production costs due to manufacturing difficulties.

Thus, a heterogeneous substrate, e.g., a sapphire substrate, a silicon carbide substrate, or the like, may be used. The sapphire substrate is utilized relatively more often than the relatively costly silicon carbide substrate. When a heterogeneous substrate is used, defects such as, for instance, dislocation may be increased due to differences in lattice constants between a substrate material and a thin film material. Also, differences in coefficients of thermal expansion between the substrate material and the thin film material may cause bowing or warpage due to changing temperatures, and the bowing may cause cracks in the thin film. This problem may be reduced by using a buffer layer 2002 based on GaN between the substrate 2001 and the thin film material, e.g., the light emitting laminate S based on GaN.

The substrate 2001 may be fully or partially removed or patterned during a chip manufacturing process in order to enhance optical or electrical characteristics of the light emitting device before or after the light emitting laminate S is grown.

For example, a sapphire substrate may be separated by irradiating a laser on the interface between the substrate and a semiconductor layer through the substrate, and a silicon substrate or a silicon carbide substrate may be removed through a method such as polishing/etching, or the like.

In removing the substrate 2001, a support substrate may be used. For example, in order to enhance luminance efficiency of the light emitting device on the opposite side of the original growth substrate, the support substrate may be bonded by using a reflective metal or a reflective structure may be inserted into the center of a junction layer.

The substrate 2001 may be patterned to form a concave-convex surface or a sloped surface on a main surface (e.g., one or both of top and bottom surfaces of the substrate) or lateral surfaces of the substrate 2001 before or after the growth of the light emitting laminate S, such that light extraction efficiency is enhanced. A pattern size may be selected within the range from 5 nm to 500 μm. The substrate 2001 may have a regular or irregular pattern to enhance light extraction efficiency. The substrate 2001 may have various shapes such as a columnar shape, a peaked shape, a hemispherical shape, a polygonal shape, etc.

For example, the sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), etc. The C-plane of sapphire crystal allows a nitride thin film to be relatively easily grown thereon and to be stable at high temperatures. Accordingly, the sapphire substrate is commonly used as a nitride growth substrate.

The substrate 2001 may also be made of silicon (Si). Because a silicon (Si) substrate is more appropriate for increasing a diameter and is relatively low in price, it may be used to facilitate mass-production. A difference in lattice constants between the silicon substrate having (111) plane as a substrate surface and GaN is approximately 17%. Thus, a technique of suppressing the generation of crystal defects due to the difference between the lattice constants may be required. Also, a difference in coefficients of thermal expansion between silicon and GaN is approximately 56%. Thus, a technique of suppressing bowing of a wafer generated due to the differences in the coefficients of thermal expansion may be required. Bowed wafers may result in cracks in the GaN thin film and make it difficult to control processes to increase dispersion of emission wavelengths of light in the wafer.

The silicon substrate may absorb light generated in the GaN-based semiconductor, thereby lowering external quantum yield of the light emitting device. Thus, the substrate may be removed and a support substrate such as a silicon substrate, a germanium substrate, a SiAl substrate, a ceramic substrate, a metal substrate, or the like, including a reflective layer may be additionally formed.

[Buffer Layer]

When a GaN thin film is grown on a heterogeneous substrate, e.g., the silicon substrate, dislocation density may be increased due to a lattice constant mismatch between a substrate material and a thin film material, and cracks and warpage may be generated due to a difference between thermal expansion coefficients. In order to prevent dislocation of and cracks in the light emitting laminate S, the buffer layer 2002 may be disposed between the substrate 2001 and the light emitting laminate S. The buffer layer 2002 may serve to adjust a degree of warpage of the substrate when an active layer is grown, and to reduce a wavelength dispersion of a wafer.

The buffer layer 2002 may be made of $Al_xIn_yGa_{1-x-y}N$ ($0 \leq x \leq 1$, $0 \leq y \leq 1$), in particular, GaN, AlN, AlGaN, InGaN, or InGaNAlN, and a material such as $ZrB_2$, $HfB_2$, ZrN, HfN, TiN, or the like, may also be used. Also, the buffer layer may be formed by combining a plurality of layers or by gradually changing a composition.

A silicon (Si) substrate has a thermal expansion coefficient significantly different from that of GaN. Thus, in the case of growing a GaN-based thin film on the silicon substrate, when a GaN thin film is grown at a high temperature and is subsequently cooled to room temperature, tensile stress may be applied to the GaN thin film due to the differences in the coefficients of thermal expansion between the silicon substrate and the GaN thin film, thereby generating cracks. In order to prevent or reduce the generation of cracks, a method of growing the GaN thin film such that compressive stress is applied to the GaN thin film may be used to compensate for the tensile stress.

A difference in the lattice constants between silicon (Si) and GaN may generate defects. In the case of a silicon substrate, a buffer layer having a composite structure may be used to control stress such that warpage (or bowing) and/or defects are restrained or controlled.

For example, first, an AlN layer is formed on the substrate 2001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the center of GaN between the plurality of AlN layers to control stress.

[Light Emitting Laminate]

The light emitting laminate S having a multilayer structure of a Group III nitride semiconductor will be described in detail. The first and second conductivity-type semiconductor layers 2004 and 2006 may be formed of n-type and p-type impurity-doped semiconductors, respectively.

However, the present inventive concepts are not limited thereto. Thus, the first and second conductivity-type semiconductor layers 2004 and 2006 may be formed of p-type and n-type impurity-doped semiconductors, respectively. For example, the first and second conductivity-type semiconductor layers 2004 and 2006 may be made of a Group III nitride semiconductor, e.g., a material having a composition of $Al_xIn_yGa_{1-x-y}N$ ($0 \le x \le 1$, $0 \le y \le 1$, $0 x+y \le 1$). Of course, the present inventive concepts are not limited thereto and the first and second conductivity-type semiconductor layers 2004 and 2006 may also be made of a material such as an AlGaInP-based semiconductor or an AlGaAs-based semiconductor.

The first and second conductivity-type semiconductor layers 2004 and 2006 may have a unilayer structure, or, alternatively, the first and second conductivity-type semiconductor layers 2004 and 2006 may have a multilayer structure including layers having, for instance, different compositions, different thicknesses, etc. For example, the first and second conductivity-type semiconductor layers 2004 and 2006 may have a carrier injection layer for improving electron and hole injection efficiency, or may have various types of superlattice structure, respectively.

The first conductivity-type semiconductor layer 2004 may further include a current diffusion layer (not shown) in a region adjacent to the active layer 2005. The current diffusion layer may have a structure in which a plurality of $In_x Al_y Ga_{(1-x-y)}N$ layers having different compositions or different impurity contents are iteratively laminated or may have an insulating material layer partially formed therein.

The second conductivity-type semiconductor layer 2006 may further include an electron blocking layer (not shown) in a region adjacent to the active layer 2005. The electron blocking layer may have a structure in which a plurality of $In_x Al_y Ga_{(1-x-y)}N$ layers having different compositions are laminated or may have one or more layers including $Al_y Ga_{(1-y)}N$. The electron blocking layer has a band gap wider than that of the active layer 2005, thus preventing electrons from being transferred via the second conductivity-type (p-type) semiconductor layer 2006.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) may be supplied to a reaction container in which the substrate 2001 is installed as reactive gases, while the substrate may be maintained at a high temperature ranging from 900° C. to 1,100° C. While a gallium nitride-based compound semiconductor is being grown (e.g., being laminated), an impurity gas may be supplied to laminate the gallium nitride-based compound semiconductor as a doped n-type or p-type semiconductor. Silicon (Si) is a well-known n-type impurity and p-type impurities may include zinc (Zn), cadmium (Cd), beryllium (Be), magnesium (Mg), calcium (Ca), barium (Ba), etc. Among them, magnesium (Mg) and zinc (Zn) may be mainly used.

Also, the active layer 2005 disposed between the first and second conductivity-type semiconductor layers 2004 and 2006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic Contact Layer and First and Second Electrodes]

The ohmic contact layer 2008 may have a relatively high impurity concentration to have low ohmic contact resistance, thereby lowering an operating voltage of the element and enhance element characteristics. The ohmic contact layer 2008 may be formed of a GaN layer, an InGaN layer, a ZnO layer, or a graphene layer.

The first or second electrode 2009a or 2009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

The LED chip illustrated in FIG. 14 has a structure in which first and second electrodes face the same surface as a light extraction surface, but it may also be implemented to have various other structures, such as a flip-chip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, etc.

Light Emitting Device

Second Example

Figure 15:
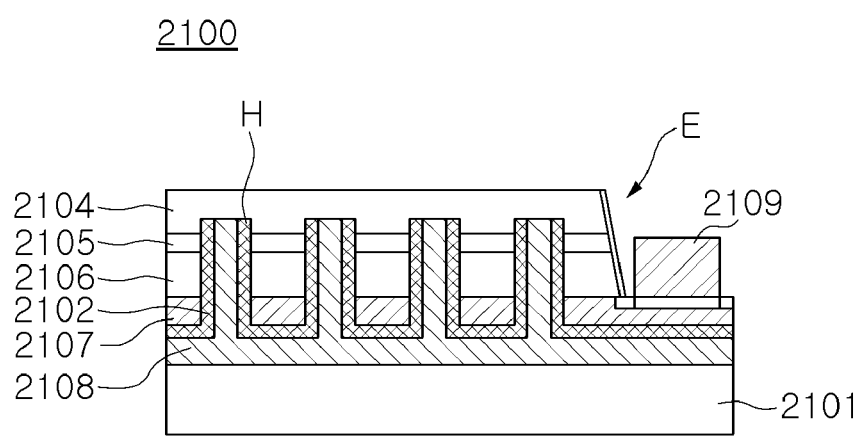
FIG. 15 is a cross-sectional view schematically illustrating another example embodiment of a light emitting device employable in the lighting unit in FIG. 3.

In the case of manufacturing a large light emitting device for a high output, an LED chip illustrated in FIG. 15 having a structure promoting current spreading efficiency and heat dissipation efficiency may be provided.

As illustrated in FIG. 15, the LED chip 2100 (one embodiment of the light emitting device 14001 of FIG. 13) may include a first conductivity-type semiconductor layer 2104, an active layer 2105, a second conductivity-type semiconductor layer 2106, a second electrode layer 2107, an insulating layer 2102, a first electrode 2108, and a substrate 2101, laminated sequentially. Here, in order to be electrically connected to the first conductivity-type semiconductor layer 2104, the first electrode layer 2108 includes one or more contact holes H extending from one surface of the first electrode layer 2108 to at least a partial region of the first conductivity-type semiconductor layer 2104 and electrically insulated from the second conductivity-type semiconductor layer 2106 and the active layer 2105. However, the first electrode layer 2108 may not be included in some of example embodiments.

The contact hole H may extend from an interface between the first electrode layer 2108 and the second electrode layer 2017, passing through the second electrode layer 2107, the second conductivity-type semiconductor layer 2106, and the first active layer 2105, to the interior of the first conductivity-type semiconductor layer 2104. The contact hole H may extend at least to an interface between the active layer 2105 and the first conductivity-type semiconductor layer 2104. The contact hole H may extend to a portion of the first conductivity-type semiconductor layer 2104. Because the contact hole H is formed for electrical connectivity and current spreading, the purpose of the presence of the contact hole H may be achieved when it is in contact with the first conductivity-type semiconductor layer 2104. Thus, the contact hole H may not extend to an external surface of the first conductivity-type semiconductor layer 2104.

The second electrode layer 2107 formed under the second conductivity-type semiconductor layer 2106 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), etc, in consideration of a light reflecting function and an ohmic contact function with the second conductivity-type semiconductor layer 2106, and may be formed by using a process such as sputtering, deposition, or the like.

The contact hole H may have a form penetrating the second electrode layer 2107, the second conductivity-type semiconductor layer 2106, and the active layer 2105 so as to be connected to the first conductivity-type semiconductor layer 2104. The contact hole H may be formed by using an etching process, e.g., inductively coupled plasma-reactive ion etching (ICP-RIE), or the like.

The insulating layer 2102 may be formed to cover a side wall of the contact hole H and a lower surface of the second conductivity-type semiconductor layer 2106. For example, at least a portion of the first conductivity-type semiconductor layer 2104 may be exposed by the contact hole H. The insulating layer 2102 may be formed by depositing an insulating material such as $SiO_2$, $SiO_xN_y$, or $Si_xN_y$.

The first electrode layer 2108 may include a conductive via portion, which is formed by filling the contact hole H with a conductive material. Subsequently, the substrate 2101 may be formed on the first electrode layer 2108. In this structure, the substrate 2101 may be electrically connected to the first conductivity-type semiconductor layer 2104 via the conductive via portion of the first electrode layer 2108.

The substrate 2101 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, etc. However, example embodiments of the inventive concepts are not limited thereto.

In order to reduce contact resistance, the amount, a shape, a pitch, and/or a contact area of the contact hole H with respect to the first and second conductivity-type semiconductor layers 2104 and 2106 may be appropriately regulated. The contact holes H may be arranged to have various shapes in rows and columns to improve a current flow. For example, the second electrode layer 2107 may have one or more exposed regions in the interface between the second electrode layer 2017 and the second conductivity-type semiconductor layer 2106, e.g., an exposed region E. An electrode pad unit 2109 connecting an external power source to the second electrode layer 2107 may be provided on the exposed region E.

In this manner, the LED chip 2100 illustrated in FIG. 15 may include the light emitting structure having the first and second main surfaces opposing one another and having the first and second conductivity-type semiconductor layers 2104 and 2106 providing the first and second main surfaces, respectively, and the active layer 2105 formed therebetween, the contact holes H connected to a region of the first conductivity-type semiconductor layer 2104 through the active layer 2105 from the second main surface, the first electrode layer 2108 formed on the second main surface of the light emitting structure and connected to a region of the first conductivity-type semiconductor layer 2104 through the contact holes H, and the second electrode layer 2107 formed under the second main surface of the light emitting structure and connected to the second conductivity-type semiconductor layer 2106. For example, any one of the first and second electrodes 2108 and 2107 may be led out in a lateral direction of the light emitting structure.

Light Emitting Device

Third Example

A lighting unit using LEDs provides improved heat dissipation characteristics. Further, the lighting unit employing an LED chip may have a relatively low heating value. As an LED chip satisfying such requirements, an LED chip including a nano-structure (hereinafter, referred to as a 'nano-LED chip') may be used.

Such a nano-LED chip may include a recently developed core/shell type nano-LED chip, which has a low binding density to generate a relatively low degree of heat, has increased luminous efficiency by increasing a light emitting region by utilizing nano-structures, and may minimize or prevent a degradation of efficiency due to polarization by obtaining a non-polar active layer, thereby improving drop characteristics.

Figure 16:
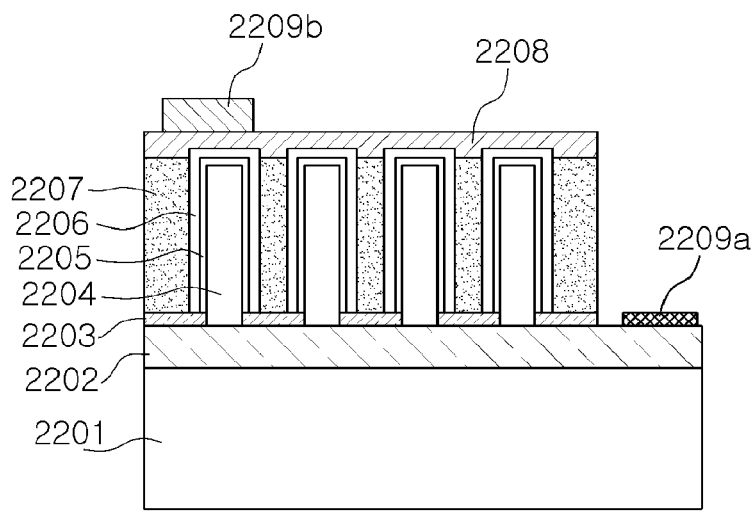
FIG. 16 is a cross-sectional view schematically illustrating still another example embodiment of the light emitting device employable in the lighting unit in FIG. 3.

FIG. 16 is a cross-sectional view illustrating still another example embodiment of an LED chip employable in the foregoing lighting device.

As illustrated in FIG. 16, a nano-LED chip 2200 may include a plurality of nano-scale light emitting structures formed on a substrate 2201. In this example embodiment, the nano-scale light emitting structure having a core-shell structure as a rod structure is illustrated. However, example embodiments of the inventive concepts are not limited thereto and the nano-scale light emitting structure may have a different structure such as a pyramid structure.

The nano-LED chip 2200 may include a base layer 2202 formed on the substrate 2201. The base layer 2202 may be a layer providing a growth surface for the nano-scale light emitting structure. The base layer 2202 may be a first conductivity-type semiconductor layer. A masking layer 2203 having an open area for the growth of the nano-scale light emitting structure (in particular, the core) may be formed on the base layer 2202. The masking layer 2203 may be made of a dielectric material such as $SiO_2$ or $SiN_x$.

In the nano-scale light emitting structure, a first conductivity-type nano-core 2204 may be formed by selectively growing a first conductivity-type semiconductor by using the masking layer 2203 having an open area, and an active layer 2205 and a second conductivity-type semiconductor layer 2206 may be formed as shell layers on a surface of the nano core 2204. Accordingly, the nano-scale light emitting structure may have a core-shell structure in which the first conductivity-type semiconductor is the nano core and the active layer 2205 and the second conductivity-type semiconductor layer 2206 enclosing the nano core are shell layers.

The nano-LED chip 2200 may include a filler material 2207 filling spaces between the nano-scale light emitting structures. The filler material 2207 may structurally stabilize and/or optically improve the nano-scale light emitting structures. The filler material 2207 may be made of a transparent material such as $SiO_2$, or the like, but the present inventive concepts are not limited thereto. An ohmic contact layer 2208 may be formed on the nano-scale light emitting structures and connected to the second conductivity-type semiconductor layer 2206. The nano-LED chip 2200 may include first and second electrodes 2209a and 2209b connected to the base layer 2202 formed of the first conductivity-type semiconductor and the ohmic contact layer 2208, respectively.

By forming the nano-scale light emitting structures to have different diameters, components, and/or doping densities, light having two or more different wavelengths may be emitted from a single element, e.g., the single lighting unit. By appropriately adjusting light having different wavelengths, white light may be implemented without using phosphors in the single element, and light having various desired colors or white light having different color temperatures may be implemented by combining different LED chips with the foregoing device or combining wavelength conversion materials such as phosphors.

Light Emitting Device

Fourth Example

Figure 17:
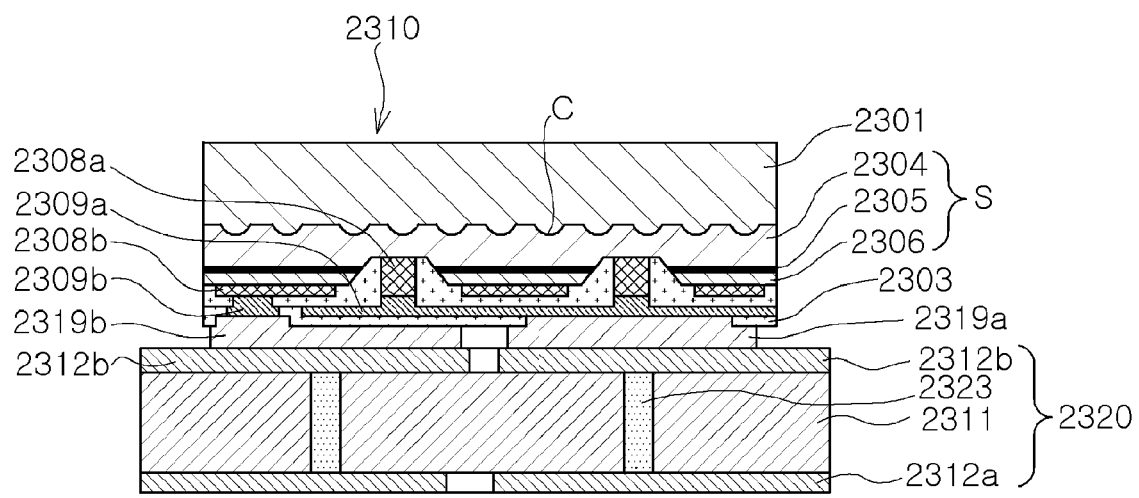
FIG. 17 is a cross-sectional view illustrating a light emitting diode (LED) chip as the light emitting device employable in the lighting unit in FIG. 3.

FIG. 17 illustrates a semiconductor light emitting device 2300 (one embodiment of the light emitting device in FIG. 3) having an LED chip 2310 mounted on a mounting substrate 2320 as a light source. The semiconductor light emitting device 2300 may be employed in the foregoing lighting device.

The semiconductor light emitting device 2300 illustrated in FIG. 17 may include an LED chip 2310 mounted on a mounting substrate 2320. The LED chip 2310 may be an LED chip having a different structure from that of the LED chips described above.

The LED chip 2310 may include a light emitting laminate S disposed in one surface of the substrate 2301 and first and second electrodes 2308a and 2308b disposed on the same surface of the substrate 2301. Also, the LED chip 2310 may include an insulating unit 2303 covering the first and second electrodes 2308a and 2308b.

The first and second electrodes 2308a and 2308b may be connected to first and second electrode pads 2319a and 2319b via electrical connection units 2309a and 2309b, respectively.

The light emitting laminate S may include a first conductivity-type semiconductor layer 2304, an active layer 2305, and a second conductivity-type semiconductor layer 2306 sequentially disposed on the substrate 2301. The first electrode 2308a may be provided as a conductive via connected to the first conductivity-type semiconductor layer 2304 through the second conductivity-type semiconductor layer 2306 and the active layer 2305. The second electrode 2308b may be connected to the second conductivity-type semiconductor layer 2306.

The insulating unit 2303 may have an open area exposing at least portions of the first and second electrodes 2308a and 2308b, and the first and second electrode pads 2319a and 2319b may be connected to the first and second electrodes 2308a and 2308b via the first and second electrical connection units 2309a and 2309b, respectively, through the open area.

The first and second electrodes 2308a and 2308b may be made of a conductive material having ohmic characteristics with respect to the first conductivity-type semiconductor layers 2304 and 2306 and may have a unilayer or multilayer structure, respectively. For example, the first and second electrodes 2308a and 2408b may be formed by depositing or sputtering one or more of silver (Ag), aluminum (Al), nickel (Ni), chromium (Cr), a transparent conductive oxide (TCO), etc. The first and second electrodes 2308a and 2308b may be disposed in the same direction and may be mounted in a so-called flip-chip manner on a lead frame, or the like, as described hereinafter. In this case, the first and second electrodes 2308a and 2308b may be disposed to face in the same direction.

For example, the first electrode 2308a may be connected to the first electrical connection unit 2309a by a conductive via connected to the first conductivity-type semiconductor layer 2304 by passing through the second conductivity-type semiconductor layer 2306 and the active layer 2305 within the light emitting laminate S.

The amount, a shape, a pitch, a contact area of the conductive via and the first electrical connection unit 2309a with respect to the first conductivity-type semiconductor layer 2304 may be appropriately regulated to lower contact resistance. The conductive via and the first electrical connection unit 2309a may be arranged in rows and in columns to improve current flow.

Another electrode structure may include the second electrode 2308b directly formed on the second conductivity-type semiconductor layer 2306 and the second electrical connection portion 2309b formed on the second electrode 2308b. In addition to forming electrical ohmic connection with the second conductivity-type semiconductor layer 2306, the second electrode 2308b may be made of a light reflective material such that in a state in which the LED chip 2310 is mounted as a so-called flip chip structure, light emitted from the active layer 2305 can be effectively emitted in a direction of the substrate 2301. For example, the second electrode 2308b may be made of a light-transmissive conductive material such as a transparent conductive oxide, according to a main light emitting direction.

The two electrode structures as described above may be electrically separated by the insulating unit 2303. The insulating unit 2303 may be made of any material as long as it has electrically insulating properties. For example, a material having a low degree of light absorption may be used. For example, a silicon oxide or a silicon nitride such as $SiO_2$, $SiO_xN_y$, $Si_xN_y$, or the like, may be used. Further, a light reflective filler may be dispersed within the light-transmissive material to form a light reflective structure.

The first and second electrode pads 2319a and 2319b may be connected to the first and second electrical connection units 2309a and 2309b to serve as external terminals of the LED chip 2310, respectively. For example, the first and second electrode pads 2319a and 2319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. When the LED chip is mounted on the mounting substrate 2320, the first and second electrode pads 2319a and 2319b may be bonded by using the eutectic metal. Thus, solder bumps generally required in a conventional flip-chip bonding method may not be used. Accordingly, the use of a eutectic metal may obtain improved heat dissipation effects in the mounting method in comparison to the case of using solder bumps. In this case, in order to obtain excellent heat dissipation effects, the first and second electrode pads 2319a and 2319b may be formed to occupy a relatively large area.

The substrate 2301 and the light emitting laminate S may be understood with reference to content described above with reference to FIGS. 14 and 15, unless otherwise described. Also, although not shown, a buffer layer may be formed between the light emitting structure S and the substrate 2301. The buffer layer may be employed as an undoped semiconductor layer made of a nitride, or the like, to alleviate lattice defects of the light emitting structure grown thereon.

The substrate 2301 may have first and second main surfaces opposing one another, and an uneven structure (e.g., a depression and protrusion pattern) may be formed on at least one of the first and second main surfaces. The uneven structure formed on one surface of the substrate 2301 may be formed by etching a portion of the substrate 2301 such that the uneven structure is made of the same material as that of the substrate 2301. Alternatively, the uneven structure may be made of a heterogeneous material different from the substrate 2301.

In the present example embodiment, because the uneven structure is formed on the interface between the substrate 2301 and the first conductivity-type semiconductor layer 2304, paths of light emitted from the active layer 1305 can be diverse, and thus, a light absorption ratio of light absorbed within the semiconductor layer can be reduced and a light scattering ratio can be increased, thereby increasing light extraction efficiency.

In detail, the uneven structure may be formed to have a regular or irregular shape. The heterogeneous material used to form the uneven structure may be a transparent conductor, a transparent insulator, or a material having a relatively high reflectivity. For example, the transparent insulator may be made of a material such as SiO2, SiNx, $Al_2O_3$, HfO, $TiO_2$, or ZrO. For example, the transparent conductor may be made of a transparent conductive oxide (TCO), e.g., ZnO, an indium oxide containing an additive, e.g., Mg, Ag, Zn, Sc, Hf, Zr, Te, Se, Ta, W, Nb, Cu, Si, Ni, Co, Mo, Cr, Sn. For example, the reflective material may include silver (Ag), aluminum (Al), or a distributed Bragg reflector (DBR) including multiple layers having different refractive indices. However, the present inventive concepts are not limited thereto.

The substrate 2301 may be removed from the first conductivity-type semiconductor layer 2304. To remove the substrate 2301, a laser lift-off (LLO) process using a laser, an etching or a polishing process may be used. Also, after the substrate 2301 is removed, depressions and protrusions may be formed on the surface of the first conductivity-type semiconductor layer 1304.

As illustrated in FIG. 17, the LED chip 2310 may be mounted on the mounting substrate 2320. The mounting substrate 2320 includes upper and lower electrode layers 2312b and 2312a formed on upper and lower surfaces of the substrate body 2311, and vias 2313 penetrating through the substrate body 2311 to connect the upper electrode layer 2312b to the lower electrode layer 2312a. The substrate body 2311 may be made of a resin, a ceramic, or a metal, and the upper or lower electrode layer 2312b or 2312a may be a metal layer including gold (Au), copper (Cu), silver (Ag), and/or aluminum (Al).

The substrate on which the foregoing LED chip 2310 is mounted is not limited to the configuration of the mounting substrate 2320 illustrated in FIG. 17, and any substrate having a wiring structure for driving the LED chip 2310 may be employed. For example, a package structure in which an LED chip is mounted on a package body having a pair of lead frames may be provided.

<Other Examples of Light Emitting Devices>

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be used.

The light emitting device may be configured to include at least one of a light emitting device emitting white light by combining green, red, and orange phosphors with a blue LED chip and a purple, blue, green, red, and/or infrared light emitting devices. The light emitting device 14001 may have a color rendering index (CRI) adjusted to range from 40, which is a level for sodium (Na) to 100, which is a level of a sunlight, and have a color temperature ranging from 1,500K, which is a level of candlelight to 12,000K, which is a level of a blue sky, to generate various types of white light. If necessary, the light emitting device 14001 may generate visible light having purple, blue, green, red, orange colors, or infrared light to adjust an illumination color according to a surrounding atmosphere or mood. Also, the light source apparatus may generate light having a special wavelength stimulating plant growth.

Figure 18:
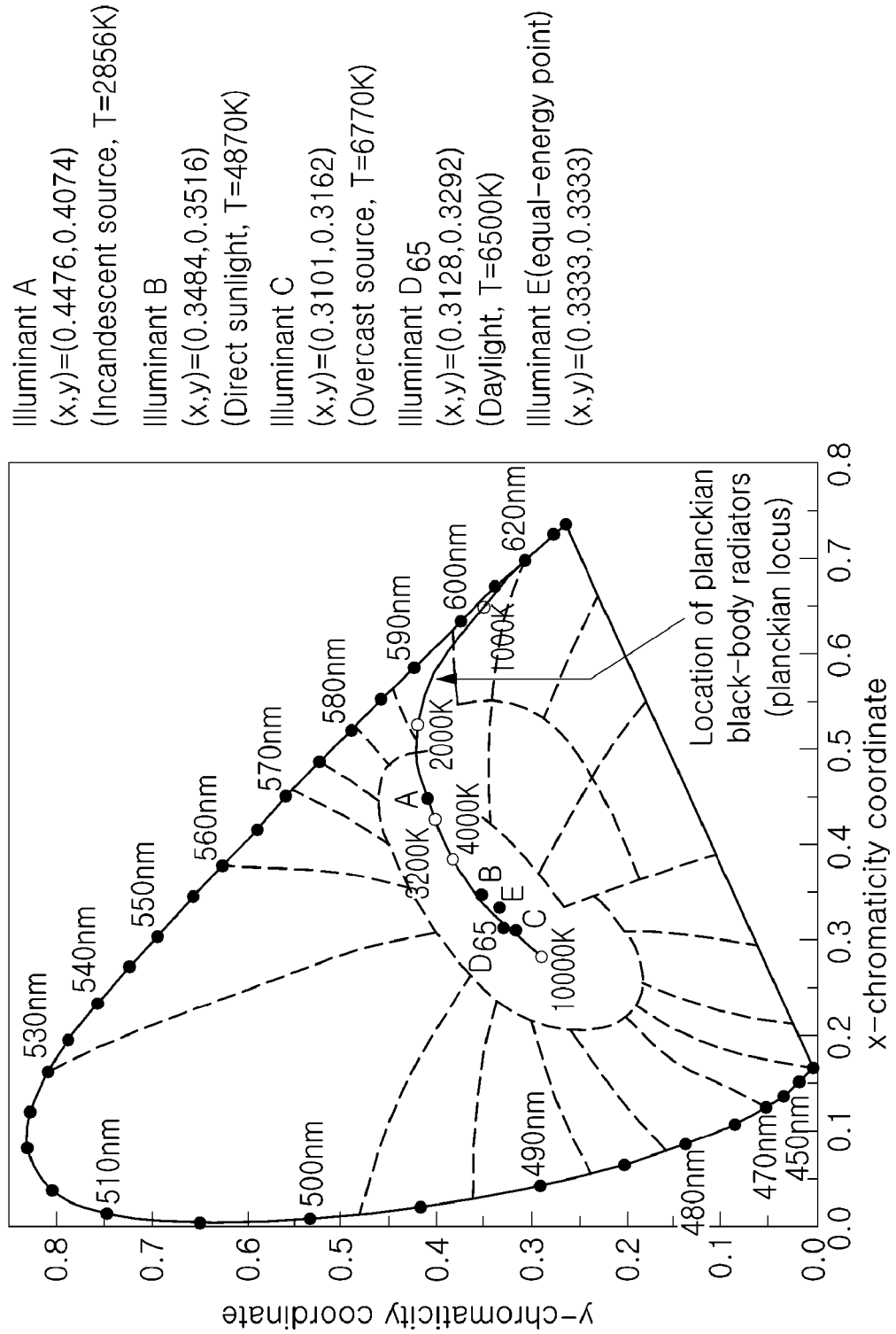
FIG. 18 is the CIE 1931 color space chromaticity diagram.

White light generated by combining yellow, green, or red phosphors to a blue LED chip, and/or by combining green and red LED chips may have two or more peak wavelengths and may be provided in a segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 18. Alternatively, white light may be provided in a region surrounded by a spectrum of black body radiation and the segment. A color temperature of white light may correspond to a range from 2,000K to 20,000K.

Phosphors may have the following empirical formula and colors.

Oxide system: Yellow and green $Y_3Al_5O_{12}$:Ce, $Tb_3Al_5O_{12}$:Ce, $Lu_3Al_5O_{12}$:Ce.

Silicate system: Yellow and green $(Ba,Sr)_2SiO_4$:Eu, yellow and orange $(Ba,Sr)_3SiO_5$:Ce.

Nitride system: Green β-SiAlON:Eu, yellow $L_3Si_6O_{11}$:Ce, orange α-SiAlON:Eu, red $CaAlSiN_3$:Eu, $Sr_2Si_5N_8$:Eu, $SrSiAl_4N_7$:Eu.

Phosphor compositions should be basically conformed to Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone or a co-activator, or the like, may be additionally applied to change characteristics.

Also, materials such as quantum dots, or the like, may be applied as materials that replace phosphors. Phosphors and quantum dots may be used in combination or alone in an LED.

A quantum dot may have a structure including a core (3 to 10 nm), which includes, e.g., CdSe, InP, a shell (0.5 to nm), which includes, e.g., ZnS, ZnSe, and a ligand for stabilizing the core and the shell, thereby implementing various colors according to sizes.

Table 1 below shows types of phosphors in applications fields of white light emitting devices using a blue LED (440 nm to 460 nm).

TABLE 1

| Purpose | Phorphors |
| --- | --- |
| LED TV BLU | β-SiAlON: $Eu^{2+}$ |
|  | (Ca, Sr)AlSiN$_3$: $Eu^{2+}$ |
|  | $L_3Si_6O11$: $Ce^{3+}$ |
| Lighting | $Lu_3Al_5O_{12}$: $Ce^{3+}$ |
|  | Ca-α-SiAlON: $Eu^{2+}$ |
|  | $L_3Si_6N_{11}$: $Ce^{3+}$ |
|  | (Ca, Sr) AlSiN$_3$: $Eu^{2+}$ |
|  | $Y_3Al_5O_{12}$: $Ce^{3+}$ |

TABLE 1-continued

| Purpose | Phorphors |
|---|---|
| Side View (Mobile, Note PC) | $Lu_3Al_5O_{12}$: $Ce^{3+}$<br>Ca-α-SiAlON: $Eu^{2+}$<br>$L_3Si_6N_{11}$: $Ce^{3+}$<br>(Ca, Sr) AlSiN$_3$: $Eu^{2+}$<br>$Y_3Al_5O_{12}$: $Ce^{3+}$<br>(Sr, Ba, Ca, Mg)$_2$SiO$_4$: $Eu^{2+}$ |
| Electrical component (Head Lamp, etc.) | $Lu_3Al_5O_{12}$: $Ce^{3+}$<br>Ca-α-SiAlON: $Eu^{2+}$<br>$L_3Si_6N_{11}$: $Ce^{3+}$<br>(Ca, Sr)AlSiN$_3$: $Eu^{2+}$<br>$Y_3Al_5O_{12}$: $Ce^{3+}$ |

Phosphors or quantum dots may be applied by using at least one of a method of the spraying onto a light emitting device, a method of covering as a film, and a method of attaching as a sheet of ceramic phosphor, etc.

The spraying method may include dispensing, spray coating, or the like. The dispensing may include a pneumatic method and a mechanical method, e.g., a screw fastening scheme, a linear type fastening scheme, etc. Through a jetting method, an amount of dotting may be controlled through a very small amount of discharging and color coordinates (or chromaticity) may be controlled therethrough. In the case that phosphors are collectively applied on a wafer level or on a mounting board on which an LED is mounted, productivity can be enhanced and a thickness thereof can be easily controlled.

The method of directly covering a light emitting device with phosphors or quantum dots as a film may include electrophoresis, screen printing, or a phosphor molding method, and these methods may be varied according to whether a lateral surface of a chip is to be coated or not.

In order to control efficiency of a long wavelength light emitting phosphor re-absorbing light emitted in a short wavelength, two types of phosphor layer having different light emitting wavelengths may be provided. In order to minimize light re-absorption and interference between two or more wavelengths, a DBR (ODR) layer may be included between respective layers. In order to form a uniformly coated film, a phosphor may be fabricated as a film or a ceramic form and attached to a chip or a light emitting device.

In order to differentiate light efficiency and light distribution characteristics, a light conversion material may be provided in a remote form. For example, the light conversion material may be provided together with a material such as a light-transmissive polymer, glass, or the like, according to durability and heat resistance.

A phosphor application technique may play an important role in determining light characteristics in an LED device. Thus, techniques of controlling, e.g., a thickness and/or a distribution uniformity of a phosphor application layer have been variously researched.

A quantum dot (QD) may also be provided in a light emitting device in the same manner as that of a phosphor, and may be provided in glass or a light-transmissive polymer material to perform optical conversion.

In order to protect a light emitting device from an external environment or in order to improve light extraction efficiency of light emitted to the outside of a light emitting device, a light-transmissive material may be provided on the light emitting device as a filler. For example, a transparent organic solvent such as epoxy, silicon, a hybrid of epoxy and silicon, or the like, may be applied as a light-transmissive material. The light-transmissive material may be cured according to, e.g., heating, light irradiation, and a time-lapse method.

In the case of silicon, polydimethyl siloxane is classified as a methyl-based silicon and polymethylphenyl siloxane is classified as a phenyl-based silicon. The methyl-based silicon and the phenyl-based silicon may have differences in refractive indexes, water vapor transmission rates, light transmittance amounts, light fastness qualities, and thermo-stability. Also, the methyl-based silicon and the phenyl-based silicon may have differences in curing speeds according to a cross linker and a catalyst, thereby affecting phosphor distribution.

Light extraction efficiency may vary according to a refractive index of a filler. In order to minimize a gap between a refractive index of the outermost medium of a chip of a portion from which blue light is emitted and a refractive index of a portion emitted by air, two or more types of silicon having different refractive indices may be sequentially laminated.

In general, the methyl-based silicon has a relatively high level of thermo-stability. Accordingly, variations due to a temperature increase may be reduced in order of phenyl-based silicon, hybrid silicon, and epoxy silicon. Silicon may be classified as a gel-type silicon, an elastomer-type silicon, and a resin-type silicon according to the degree of hardness thereof.

The light emitting device may further include an optical element for radially guiding light irradiated from the light source unit 14003. For example, a previously formed optical element may be attached to a light emitting device, or a fluidic organic solvent may be injected into a mold having a light emitting device mounted therein and solidified.

The optical device attachment method includes, e.g., directly attaching an optical element to a filler, and bonding only an upper portion of a chip or an outer portion of a light emitting device or an outer portion of the optical element. As the method of injecting into a mold, injection molding, transfer molding, compression molding, or the like, may be used. Light distribution characteristics may be changed according to shapes of lenses (concave, convex, uneven, conical, or other geometrical structures), and the optical element may be modified according to efficiency and light distribution characteristics.

Figure 19:
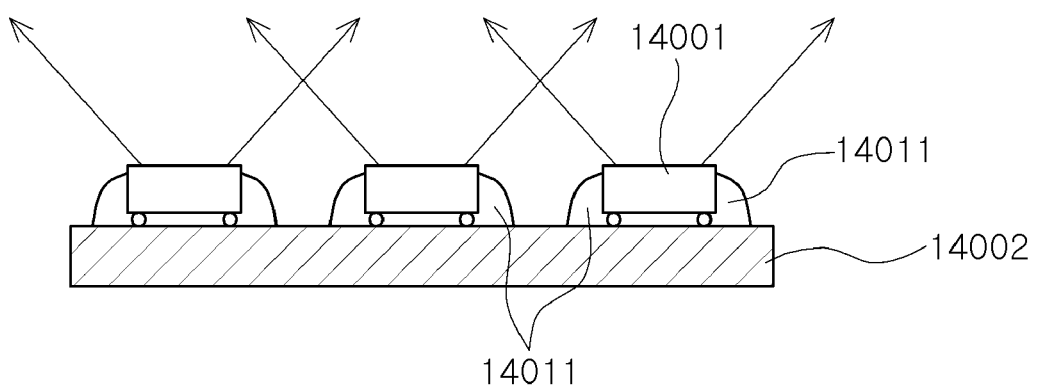
FIG. 19 is a cross-sectional view schematically illustrating a state in which light emitting devices are mounted on a circuit board in FIG. 3.

In the present example embodiment, the light emitting device 14001 is illustrated as being a single package unit including an LED chip therein, but example embodiments of the inventive concepts are not limited thereto. For example, as illustrated in FIG. 19, the light emitting device 14001 may be an LED chip itself. In this case, the LED chip may be a chip on board (COB) type chip mounted on the circuit board 14002 and directly electrically connected to the circuit board 14002 through a flip-chip bonding method or a wire bonding method.

Also, a waterproof agent 14011 may be formed between the circuit board 14002 and the light emitting device 14001 to surround the ambient regions of the light emitting device 14001.

The lighting device 100 having various lighting units 140 may be controlled by the user terminal 200 as follows.

The user terminal 200 may be any information technology (IT) device, such as a smartphone, a cellular phone, a notebook computer, an MP3 player, or the like, as long as it is portable and is available for near field communications (NFC). As an example, a case in which the user terminal 200 is a smartphone will be described.

As illustrated in FIG. 1, the user terminal 200 may include a terminal controller 210, a wireless communication module 220 (e.g. Bluetooth module), a memory unit 230, a display unit 250, and a camera module 260, and may further include an input unit 240 allowing a user to input a command to the user terminal 200.

The input unit 240 may generate key input data input to control an operation of the user terminal 200. The input unit 240 may include a keypad, a dome switch, a touch pad, a jog wheel, a jog switch, a finger mouse, etc. For example, when the touch pad and the display unit 250 are overlaid in a layered manner, the touch pad may constitute a touch screen.

The memory unit 230 may store an application, which is used by the terminal controller 210 to perform processing and controlling operations, and may serve to temporarily store input or output data. As the memory unit 230, various types of storage devices such as a flash memory type, a hard disk type, or the like, and in the present embodiment, a flash memory type may be used.

The display unit 250 may output information processed in the user terminal 200, as visual information that may be recognized by the user. When the user terminal is a smartphone, user interface (UI) or a graphic user interface (GUI) related to the smartphone may be displayed.

When a touch screen is formed by overlaying the display unit 250 and the input unit 240 in a layered manner, the display unit 250 may also be used as the input unit 250. When the display unit 250 is configured as a touch screen, it may include a touch screen panel, a touch screen panel controller, etc. For example, the touch screen panel may be a transparent panel attached to an outer side and may be connected to the interior of the user terminal 200. The touch screen panel may await a contact result, e.g., a touch). When a touch is applied, the touch screen panel may transmit corresponding signals to the touch screen panel controller. The touch screen panel controller may process the signals and transmit corresponding data to the terminal controller 210 to allow the terminal controller 210 to recognize whether a touch has been applied or to which region of the touch screen, the touch was applied.

Also, as the display unit 250, various display devices such as a liquid crystal display (LCD), a thin film transistor-liquid crystal display (TFT-LCD), an organic light emitting diode (OLED) display, a flexible display, etc, may be used.

The terminal controller 210 may control operations of the respective components to control a general operation of the user terminal 200. For example, when the user terminal 200 is a smartphone, the terminal controller 210 may perform control and processing in relation to a voice call, data communication, a video call, etc.

The lighting device authentication code 300 may include unique identification information assigned to the lighting device 100. The lighting device authentication code 300 may be imaged or scanned by an optical device, e.g., the camera module 260, etc., and be converted through an application of the user terminal 200 to extract the unique identification information.

As the lighting device authentication code 300, various types of two-dimensional (2D) or one-dimensional (1D) code such as a quick response (QR) code or a bar code may be provided. For example, a QR code may be used.

The unique identification information may include a media access control (MAC) address and a personal identification number (PIN) code of the lighting device 100.

The MAC address, a unique identification value for identifying network equipment in a network, generally has 48 bits. Because each piece of network equipment has a different MAC address value, individual pieces of network equipment may be specified by a MAC address. Thus, each lighting device 100 may be specified by assigning a MAC address thereto to identify it. Also, a MAC address may be used as a security value for accessing the individual lighting device 100.

According to an example embodiment of the present inventive concepts, because unique identification information includes a MAC address, the MAC address of the individual lighting device 100 may be extracted from the unique identification information and stored in the user terminal 200 to easily specify the individual lighting device 100 corresponding to the MAC address.

The PIN code may be assigned by a manufacturer of the lighting device 100 in advance and provided to the user. For example, a partial value of a MAC address and a value indicating a type of the individual lighting device 100 may be included in the PIN code. Thus, the user may selectively register only a particular type of lighting device 100. Also, because the user may register only the lighting device 100 whose PIN code is provided to the user, registering a lighting device, which is not wanted to be registered, by mistake may be prevented.

The PIN code may be generated by combining the low-order 1-byte value of a value obtained by adding all digits of a MAC address and a value assigned by a manufacturer to each type of lighting device 100. This will be described in detail. For example, when the low-order 1-byte value of the value obtained by adding the respective digit numbers of a MAC address is 0xFF and a value assigned by a manufacturer to the bulb-type lighting device 100 is 0x00, FF and 00 may be combined to generate a PIN code. For example, various combinations of values such as FF00, F00F, 0F0F, F0F0 may be used.

When the PIN code and the MAC address are stored as unique identification information, a security value for accessing the lighting device 100 and a type of the lighting device 100 may be recognized through the PIN code and the MAC address values.

The unique identification information having a size sufficient to be imaged may be provided to an outer side of the lighting device 100, or may be separately provided to a packaging box or directions (e.g., via instructions or a manual).

Hereinafter, a method for controlling the lighting control system 10 will be described with reference to FIGS. 2 and 21 through 24.

Figure 2:
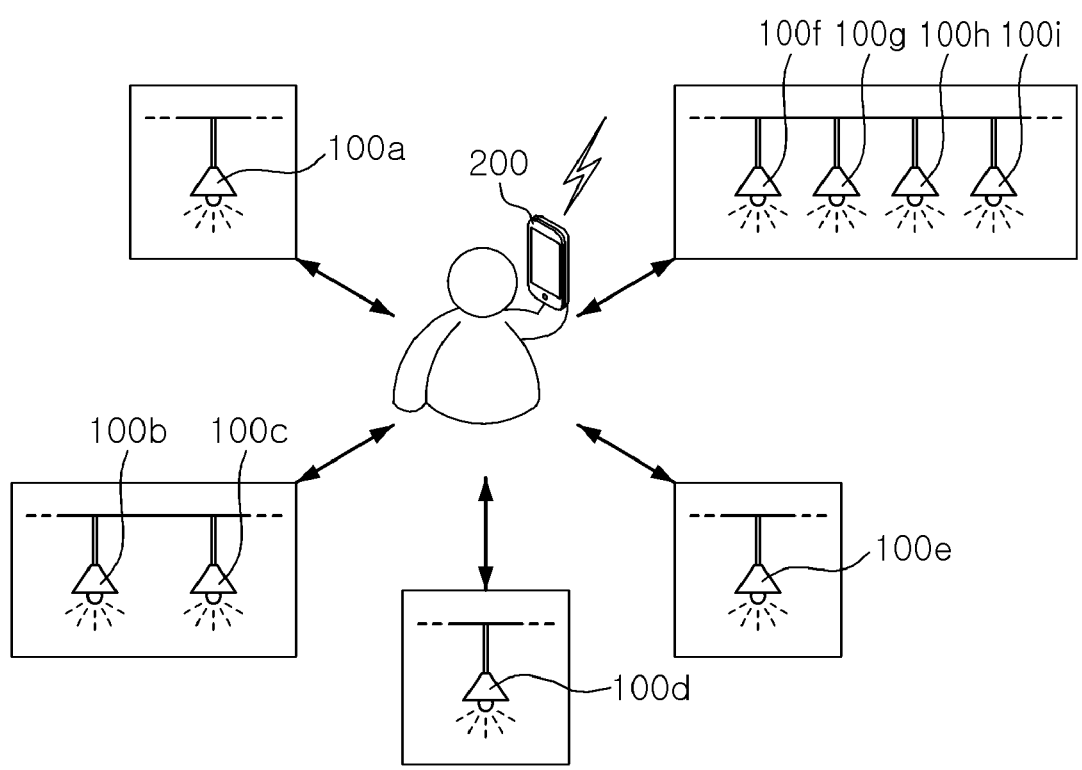
FIG. 2 is a layout view of the lighting control system according to an example embodiment of the present inventive concepts.
Figure 20:
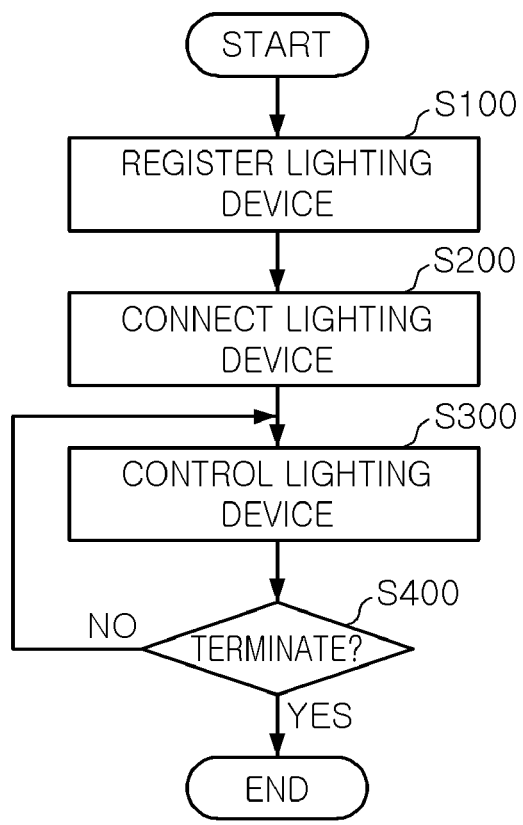
FIG. 20 is a flow chart illustrating a method for controlling the lighting control system in FIG. 1.

FIG. 2 is a layout view of the lighting control system 10 according to an example embodiment of the present inventive concepts, and FIG. 20 is a flow chart illustrating a method for controlling the lighting control system 10 in FIG. 1.

Referring to FIG. 2, a case in which nine lighting devices 100a to 100i of the lighting control system 10 are provided. For example, lighting devices 100b and 100c and lighting devices 100f to 100i may be grouped.

The method for controlling the lighting control system 10 may include registering the lighting device 100 (s100), connecting the lighting device 100 (s200), controlling the connected lighting device 100 (s300), and terminating (s400).

Figure 21:
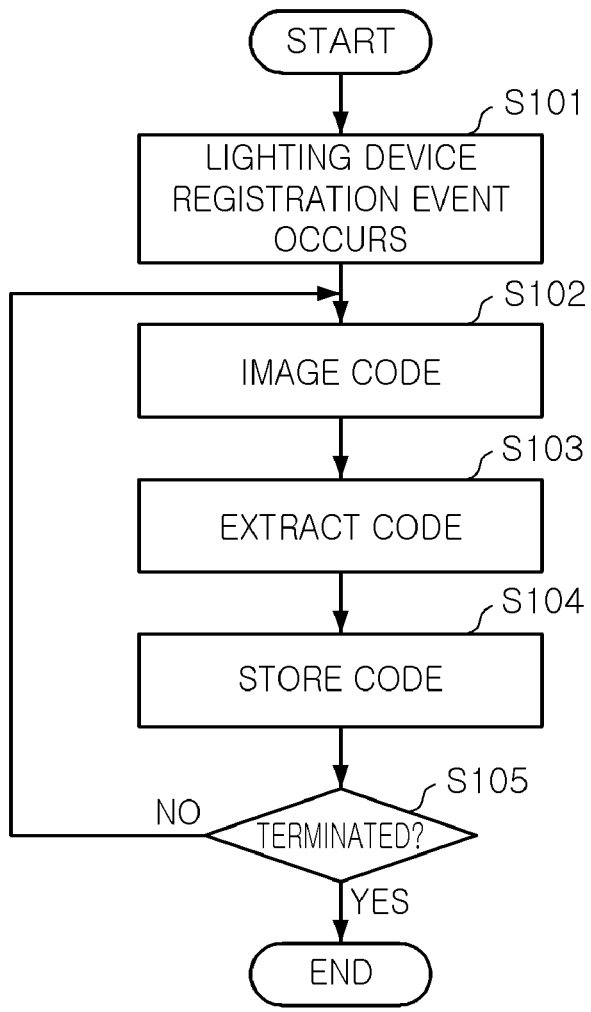
FIG. 21 is a flow chart illustrating a process of registering the lighting device in FIG. 20.
Figure 22A:
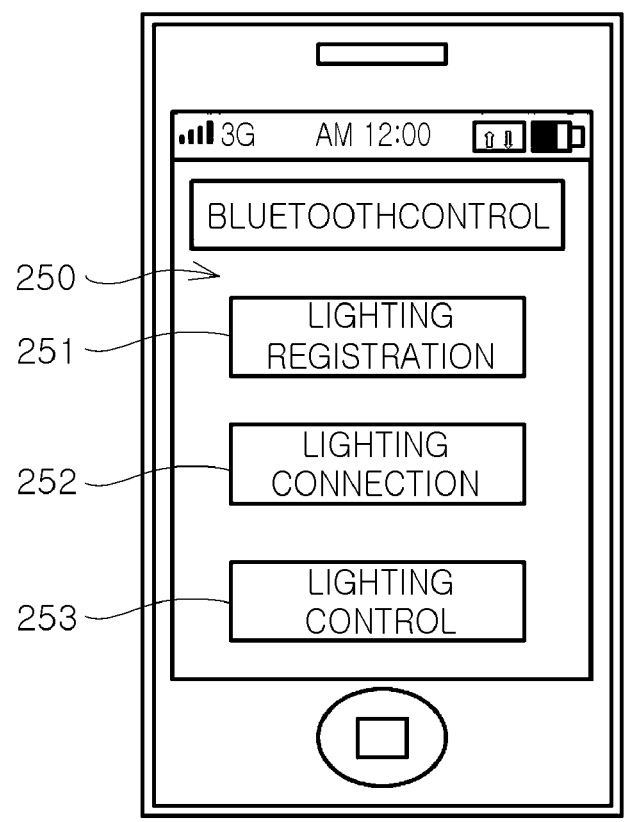
FIGS. 22A through 22C are views illustrating a process of registering the lighting device in FIG. 20.
Figure 22B:
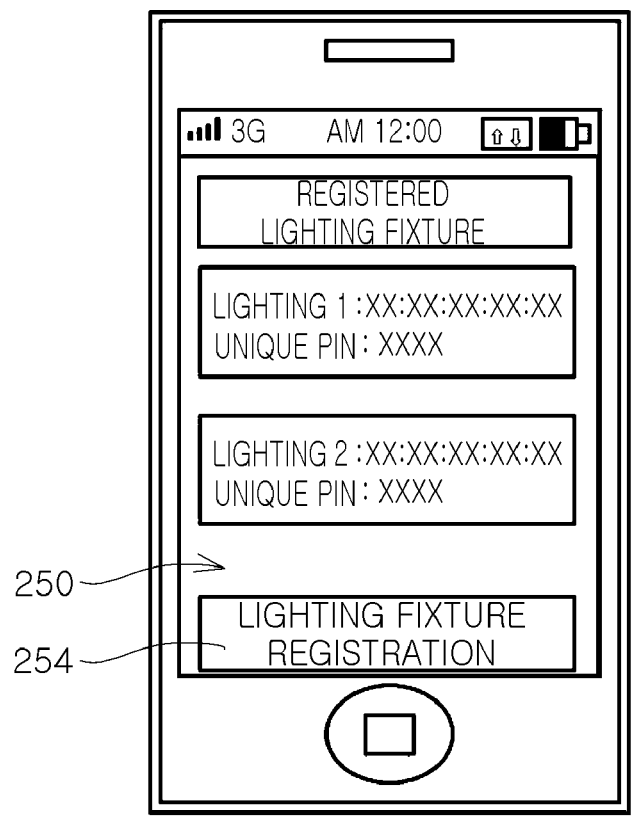

The operation (s100) of registering the lighting device 100 will be described in detail with reference to FIGS. 21 and 22. FIG. 21 is a flow chart illustrating a process of registering the lighting device 100, and FIGS. 22A through 22C are views illustrating information output to the display unit 250 of the user terminal 200 in the operation of registering the lighting device 100.

First, a lighting device registration event occurs (s101). As illustrated in FIGS. 22A through 22C, the lighting device registration event may occur as the user drives an application of the user terminal 200, selects 'lighting registration' 251 in the application, and subsequently selects 'lighting fixture registration' 254.

Figure 22C:
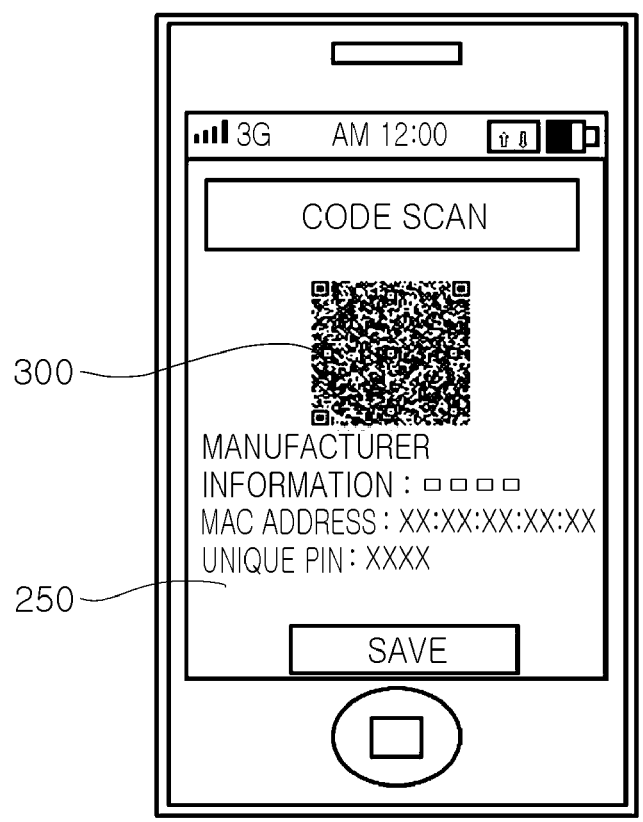

Next, as illustrated in FIG. 22C, the lighting device authentication code 300 including a unique identification code may be imaged (s102). When 'lighting fixture registration' 254 is selected during the previous process, the camera module 260 of the user terminal 200 is activated to capture an image of the lighting device authentication code 300 printed on an outer side of the lighting device 100, on a packaging box, or the like. When the user captures an image of the lighting device authentication code 300 by manipulating the input unit 240, the captured image is stored in the memory unit 230 of the user terminal 200.

Thereafter, unique identification information may be extracted from the imaged lighting device authentication code 300 (s103). For example, the unique identification information may be extracted through an application. According to an example embodiment of the present inventive concepts, a value including MAC address and a PIN code of the lighting device 100 may be extracted from the unique identification information. The MAC address and the PIN code may be output to the display unit 250 of the user terminal 100 through the application, to allow the user to check information regarding the lighting device 100 corresponding to the imaged lighting device authentication code 300.

Thereafter, the extracted unique identification information may be stored in the memory unit 230 of the user terminal 200. Accordingly, one lighting device 100 may be registered to the user terminal 200.

Thereafter, the lighting device authentication code 300 may be further imaged according to a user selection, and the lighting device registration event may be terminated (s105).

Here, the user may assign a name of the registered lighting device and store the same, or may group a plurality of lighting devices 100 under a certain single name and register the same. This will be described in detail with reference to FIG. 2. The user may store the lighting device 100*b* as 'bedroom 1', the lighting devices 100*b* and 100*c* as 'bedroom 2', the lighting device 100*d* as 'living room 1', the lighting device 100*e* as 'living room 2', and the lighting devices 100*f* to 100*i* as 'kitchen', respectively.

In this manner, when the plurality of lighting devices 100 are grouped under a certain single name and the same signal is automatically transmitted to the grouped plurality of lighting devices 100 through the application, the plurality of lighting devices 100 may be simultaneously controlled. Accordingly, the user may control the plurality of lighting devices 100 (e.g., lighting devices installed in a certain area or areas) at once.

Thereafter, the lighting device 100 may be connected to the user terminal 200 (s200). As illustrated in FIG. 22A, the event of connecting the lighting device 100 may occur as the user selects 'lighting connection 252' in the application and select only registered lighting devices 100.

Figure 23A:
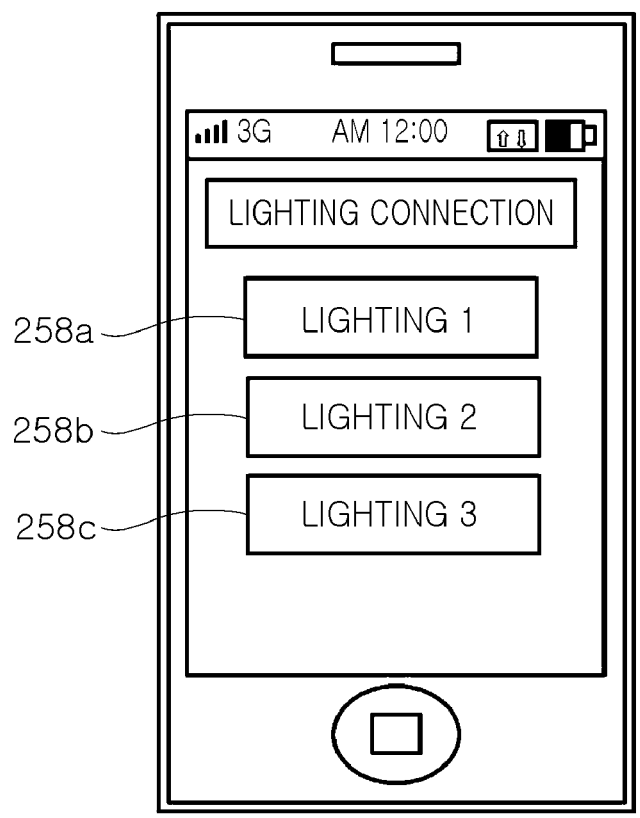
FIGS. 23A through 23B are views illustrating a process of connecting the lighting device in FIG. 20.
Figure 23B:
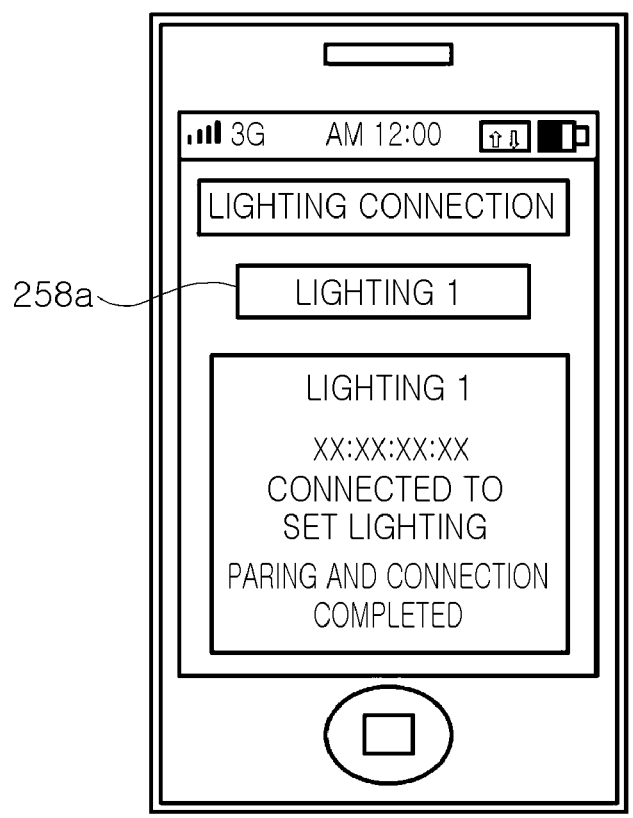

The operation of connecting the lighting device 100 may include pairing the user terminal 200 and the lighting device 100. For example, pairing may refer to a state in which a key to be used for ciphered connection is sharable, before neighboring wireless communication equipment (e.g., Bluetooth equipment) is searched and connection is attempted. When the user terminal 200 and the lighting device 100 are paired, basic device information regarding the lighting device 100 may be stored in the user terminal 200. For example, an image as illustrated in FIG. 23B may be output to the display unit 250 through the application in order to inform the user that the selected lighting device 100 and the user terminal 200 are connected.

In this manner, the operation of pairing may connect the user terminal 200 to the lighting device 100. Once paired, because the basic device information regarding the lighting device 100 is stored in the user terminal 200, when the user terminal 200 and the lighting device 100 are reconnected, they are not required to be paired again. Thus, the lighting device 100, which has once paired with the user terminal 200, may be more easily connected.

Figure 24A:
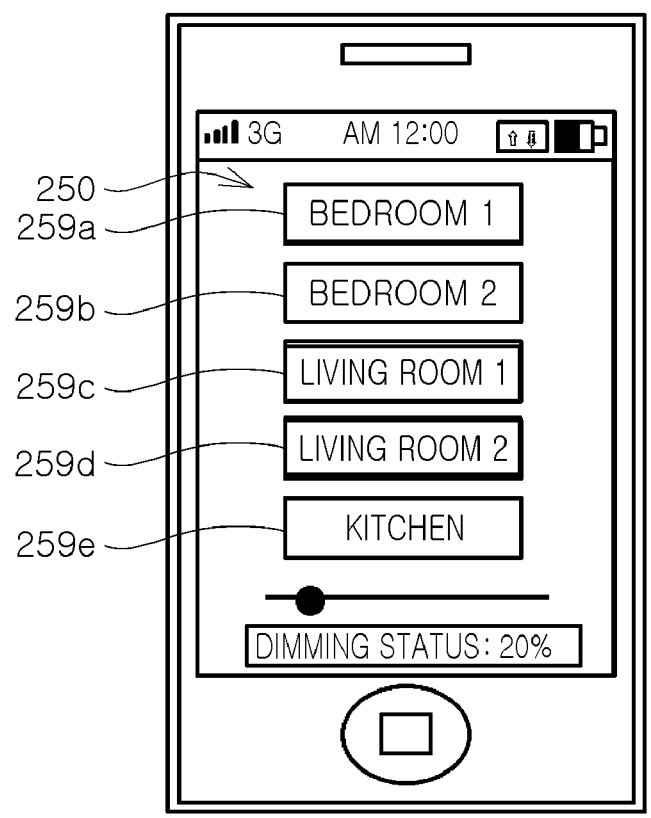
FIGS. 24A and 24B are views illustrating another example embodiment of the lighting control system according to an example embodiment of the present inventive concepts.

Thereafter, the operation S300 of controlling the lighting device 100 may be performed. An event for connecting the lighting device 100 may occur as the user selects 'lighting control 253' in the application and selects one of registered lighting devices 100. Referring to FIG. 23A, when the user selects a lighting device desired to be connected from among menus 258*a*, 258*b*, 258*c* (or menus 259*a* through 269*e* as illustrated in FIG. 24A), the user terminal 200 and the lighting device 100 may be connected thereto.

The lighting device 100 may be controlled by transmitting a control signal to the lighting device 100 from the user terminal 200. The control signal may include at least one of color, color temperature, brightness, and chroma of light emitted from the lighting unit 140 of the lighting device 100.

Figure 24B:
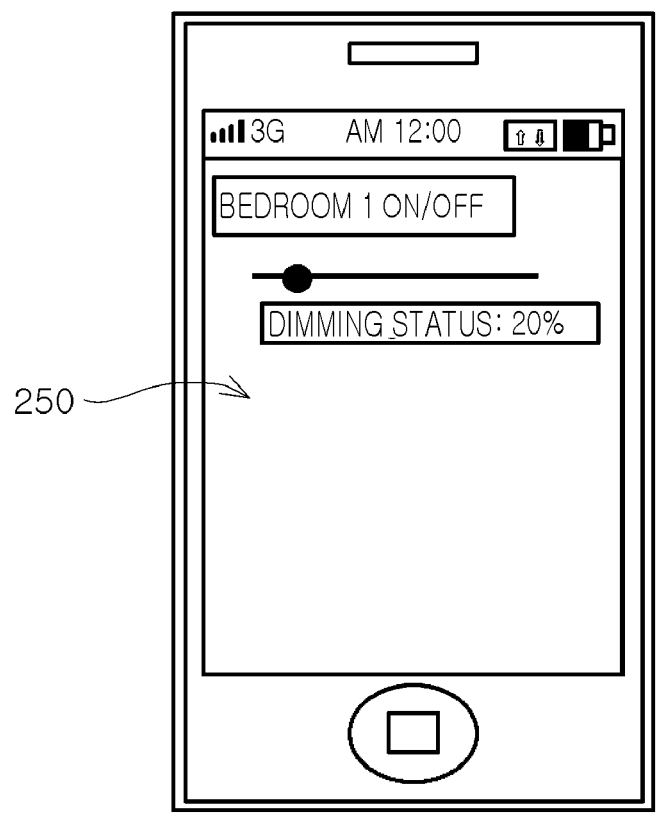

The control signal transmitted from the user terminal 200 may be generated according to various methods. Referring to FIG. 24B, after menus for controlling color, color temperature, brightness, chroma, etc, are prepared in the application, and values corresponding to values obtained by adjusting the respective menus may be transmitted as the control signal. Alternatively, a control signal set in advance by a manufacturer may be generated as a lighting device authentication code and the user may use it as a control signal.

As set forth above, according to example embodiments of the present inventive concepts, color and brightness of a plurality of lighting devices which are located in a remote area can be conveniently controlled from a certain location.

While the present inventive concepts have been shown and described in connection with example embodiments, it will be apparent to those skilled in the art that modifications and variations can be made without departing from the spirit and scope of the present inventive concepts as defined by the appended claims.

What is claimed is:

1. A lighting control system comprising:
   at least one lighting device configured to transmit and receive a wireless communication signal, the at least one lighting device controlled by a received wireless communication signal;
   a lighting device authentication code including unique identification information assigned to the at least one lighting device; and
   a user terminal including an image recognition unit, the user terminal configured to recognize the lighting device authentication code using the image recognition unit, extract the unique identification information from the lighting device authentication code, pair the user terminal with the at least one lighting device signal based on the extracted unique identification information, and control the at least one lighting device.

2. The lighting control system of claim 1, wherein the unique identification information includes a media access control (MAC) address and a personal identification number (PIN) code of the at least one lighting device.

3. The lighting control system of claim 2, wherein the PIN code includes a low-order 1-byte value of a value obtained by adding digits of the MAC address.

4. The lighting control system of claim 1, wherein the lighting device authentication code is one of a quick response (QR) code and a bar code.

5. The lighting control system of claim 1, wherein the user terminal comprises:

a camera module configured to image the lighting device authentication code;

a memory unit configured to store the extracted unique identification information and an;

a wireless communication module configured to transmit and receive the wireless communication signal;

a terminal controller configured to pair the user terminal with the lighting device, and the user terminal configured to control the lighting device using the application and the wireless communication signal; and a display unit configured to output driving information regarding the application.

6. The lighting control system of claim 1, wherein the lighting device emits white light generated by at least one of combining yellow, green, or red phosphors to a blue LED chip and by combining green or red LED chips, the white light having two or more peak wavelengths, the white light is provided in a segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram or provided in a region surrounded by a spectrum of black body radiation, and a color temperature of the white light corresponds to a range from 2,000K to 20,000K.

7. The lighting control system of claim 1, wherein the lighting device includes a plurality of LED chips having a plurality of nano-scale light emitting structures, and each of the LED chips includes, a base layer on a substrate, a masking layer on the base layer, the masking layer having a plurality of open regions defined therein, a nano-scale light emitting structure including, a first conductivity-type semiconductor nano-core protruding from the base layer through the open regions, and an active layer and a second conductivity-type semiconductor layer on a surface of the first conductivity-type nano-core, and first and second ohmic electrodes connected to the first conductivity-type nano-core and the second conductivity-type semiconductor layer, respectively.

8. The lighting control system of claim 1, wherein the lighting device includes an LED chip, and the LED chip includes, a light emitting structure including first and second conductivity-type semiconductor layers, the first and second conductivity-type semiconductor layers respectively providing first and second main surfaces, the first and second main surfaces facing one another, an active layer between the first and second conductive-type semiconductor layers, a first electrode on the second main surface, a protrusion of the first electrode passing through the second conductive-type semiconductor layer and the active layer and contacting the first conductivity-type semiconductor layer, and a second electrode below and connected to the second main surface of the light emitting structure.

9. A method for controlling a lighting control system, the method comprising:

imaging, using a user terminal, a lighting device authentication code including unique identification information of at least one lighting device;

extracting the unique identification information of the at least one lighting device;

storing the extracted unique identification information in the user terminal;

pairing the user terminal and the at least one lighting device through a wireless communication signal by using the stored unique identification information; and controlling the paired lighting device through the wireless communication signal.

10. The method of claim 9, wherein the unique identification information includes a media access control (MAC) address and a personal identification number (PIN) code of the lighting device.

11. The method of claim 10, wherein the PIN code includes a low-order 1-byte value of a value obtained by adding all digits of the MAC address.

12. The method of claim 9, wherein the extracting converts the obtained image into the unique identification information.

13. The method of claim 9, wherein the lighting device authentication code is one of a quick response (QR) code and a bar code.

14. The method of claim 9, wherein the storing stores unique identification information extracted from a plurality of lighting devices under a single name.

15. The method of claim 14, wherein the controlling controls the plurality of lighting devices grouped under the single name simultaneously.

16. A lighting control system comprising:

an image recognition unit configured to recognize a lighting device authentication code of at least one lighting device;

a wireless communication module configured to communicate wirelessly with the at least one lighting device; and a terminal controller configured to extract the unique identification information from the lighting device authentication code, and pair the user terminal with the at least one lighting device via wireless communication based on the extracted unique identification information, and control the at least one lighting device.

17. The lighting control system of claim 16, further comprising:

a memory unit configured to store at least one of an application and input/output data, the terminal controller configured to at least one of extract, pair, and control using the application.

18. The lighting control system of claim 17, further comprising:

a display unit configured to display at least one of menus of the application for user selections and pairing information.

19. The lighting control system of claim 16, wherein the unique identification information includes a media access control (MAC) address and a personal identification number (PIN) code of the at least one lighting device.

20. The lighting control system of claim 19, wherein the PIN code includes a partial value of a MAC address and a value indicating a type of an individual lighting device.

* * * * *